(12) United States Patent
Kimura

(10) Patent No.: US 7,180,364 B2
(45) Date of Patent: Feb. 20, 2007

(54) FILTER APPARATUS INCLUDING SLAVE GM-C FILTER WITH FREQUENCY CHARACTERISTICS AUTOMATICALLY TUNED BY MASTER CIRCUIT

(75) Inventor: Katsuji Kimura, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 11/045,358

(22) Filed: Jan. 31, 2005

(65) Prior Publication Data

US 2005/0168274 A1 Aug. 4, 2005

(30) Foreign Application Priority Data

Feb. 3, 2004 (JP) .............................. 2004-027051

(51) Int. Cl.
*H03K 5/00* (2006.01)
(52) U.S. Cl. ........................................ 327/553; 327/552
(58) Field of Classification Search ........ 327/552–559; 330/305
See application file for complete search history.

(56) References Cited

U.S. PATENT DOCUMENTS

| 5,117,205 | A | * | 5/1992 | Nauta | 331/117 FE |
| 5,594,383 | A | * | 1/1997 | Tamba | 327/552 |
| 5,625,317 | A | * | 4/1997 | Deveirman | 327/553 |
| 5,745,001 | A | * | 4/1998 | Ueshima et al. | 327/553 |
| 6,112,125 | A | * | 8/2000 | Sandusky | 700/28 |
| 6,114,902 | A | * | 9/2000 | Beatson et al. | 327/553 |
| 6,873,205 | B1 | * | 3/2005 | Tsividis et al. | 327/552 |
| 6,911,863 | B2 | * | 6/2005 | Kattner et al. | 327/553 |
| 2005/0242871 | A1 | * | 11/2005 | Wang | 327/552 |

FOREIGN PATENT DOCUMENTS

JP 9-320199 12/1997

OTHER PUBLICATIONS

Francois Krummenacher et al., "A 4-MHz CMOS Continuous-Time Filter with On-Chip Automatic Tuning," IEEE Journal of Solid-State Circuits, vol. 23, No. 3, pp. 950-958, Jun. 1988.

* cited by examiner

*Primary Examiner*—Dinh T. Le
(74) *Attorney, Agent, or Firm*—McGinn IP Law Group, PLLC

(57) ABSTRACT

In a filter apparatus includes a master circuit receiving a reference frequency to generate a control voltage, and a slave gm-C filter for receiving an input voltage to generate an output voltage. The slave gm-C filter is controlled by the control voltage to adjust the cut-off frequency or center frequency of the slave gm-C filter. The master circuit is a PLL circuit including a phase shifter receiving a reference frequency signal to change the phase of the reference frequency signal, a phase comparator to generate a phase error signal, and a loop filter adapted for excluding an AC component signal from the phase error signal to generate a DC component thereof. As a result, this DC component signal is supplied as the control voltage to the phase shifter and the slave gm-C filter.

16 Claims, 16 Drawing Sheets

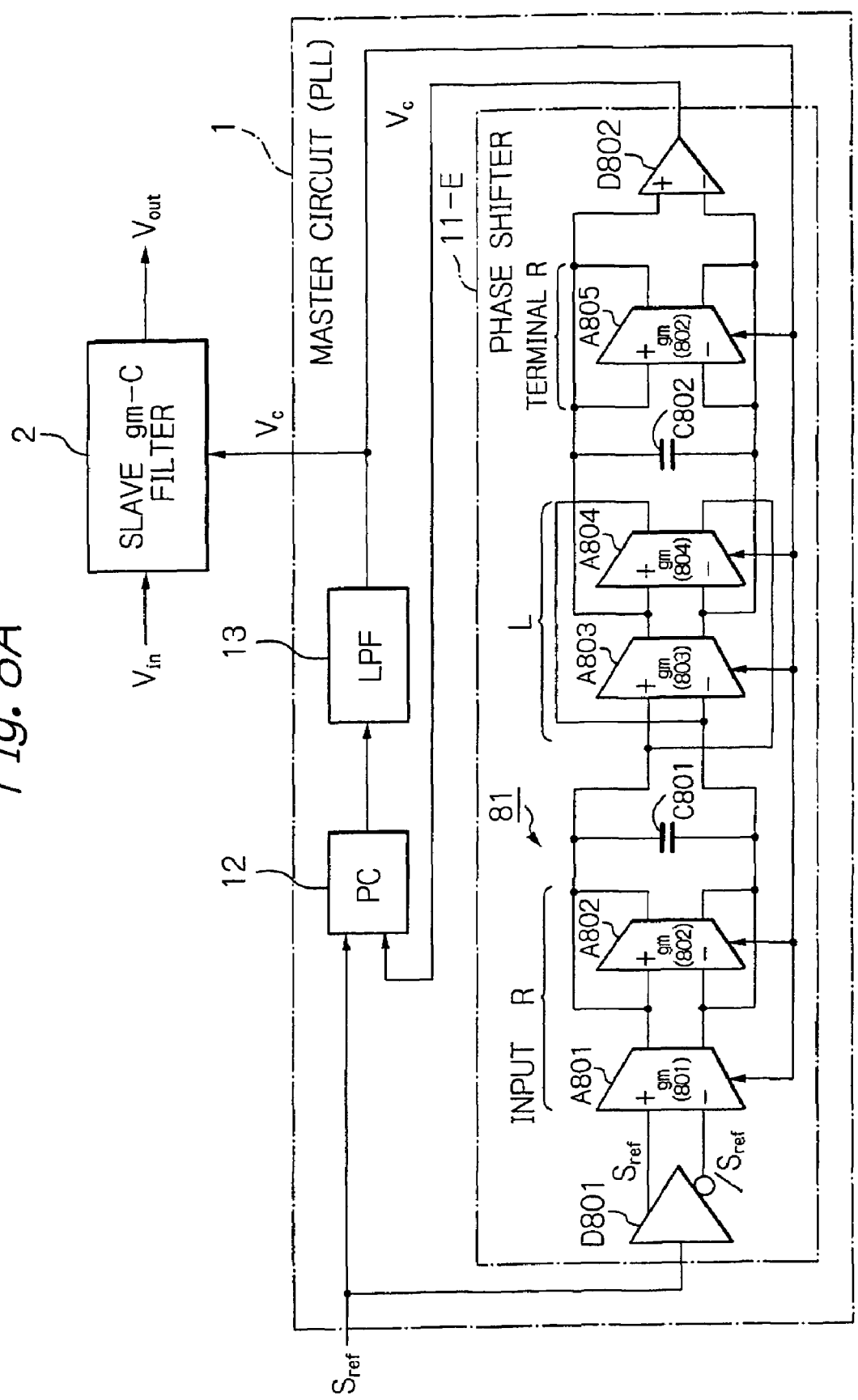

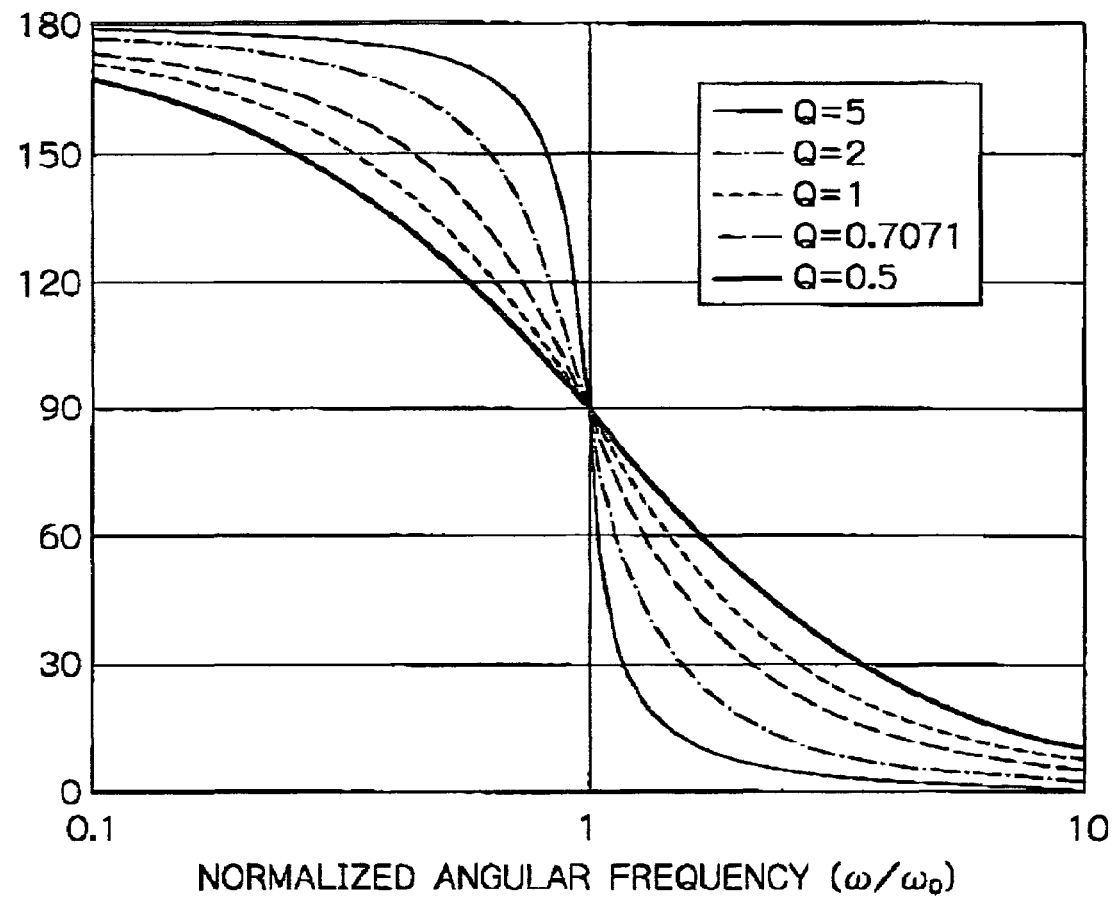

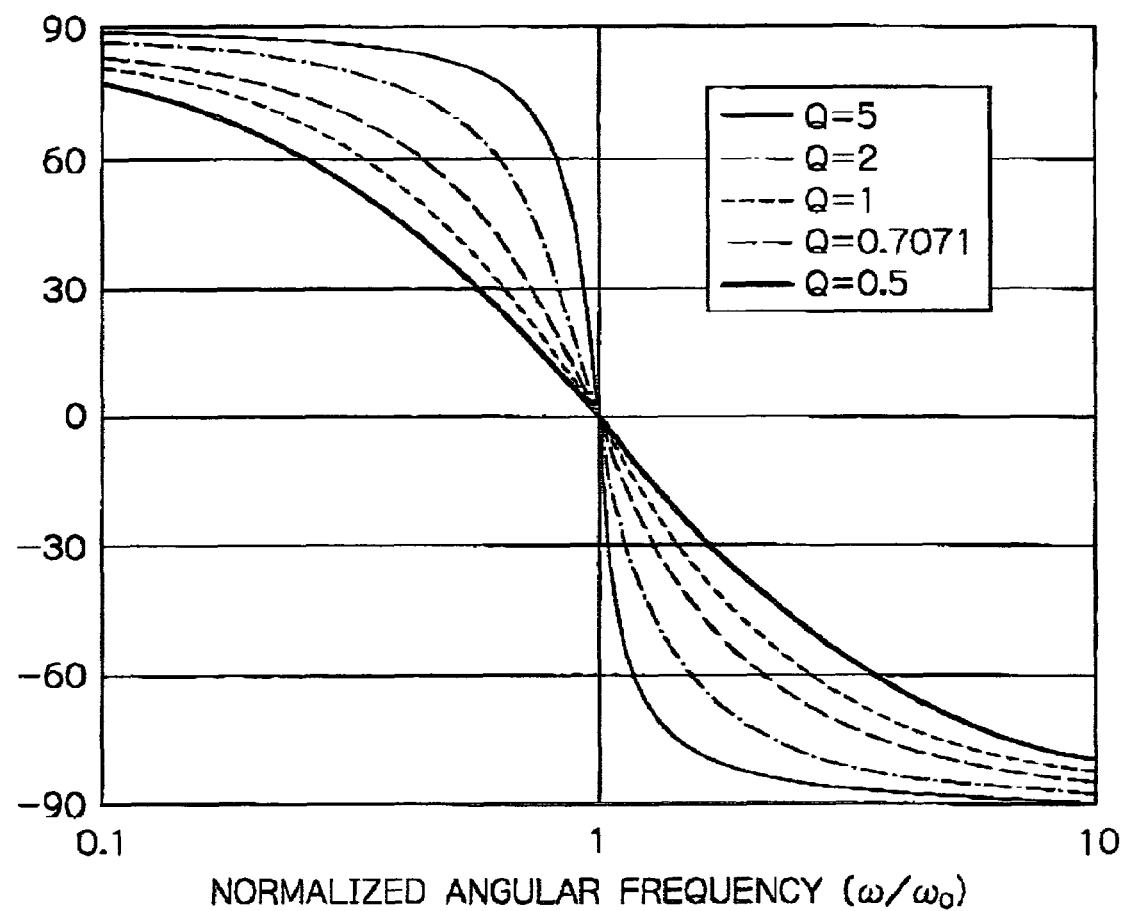

FILTER APPARATUS INCLUDING SLAVE GM-C FILTER WITH FREQUENCY CHARACTERISTICS AUTOMATICALLY TUNED BY MASTER CIRCUIT

BACKGROUND OF THE INVENTION

1. Field of the Invention

The present invention relates to a filter apparatus including a slave gi-C filter formed by operational transconductance amplifiers (OTAs: gm) and capacitors (C) and a master circuit for automatically tuning the frequency characteristics such as a cut-off frequency or center frequency of the slave gm-C filter.

2. Description of the Related Art

Wide-dynamic-range gm-C filters formed by metal oxide semiconductor (MOS) OTAs and capacitors have been developed since 1984. For these filters, automatic tuning is required to maintain precise frequency characteristics of the gm-C filters in spite of manufacturing process variations, temperature drift and the like.

A first prior art filter apparatus formed on a large scale integrated circuit (LSI) chip is constructed by a slave gm-C filter and a master circuit formed by a phase-locked loop circuit for generating a control voltage for automatically tuning the frequency characteristics of the slave gm-C filter in accordance with a reference frequency signal see: P. Krummenacher et al., "A 4-MHz CMOS Continuous-Time Filter with On-Chip Automatic Tuning", IEEE J. Solid-State Circuits, Vol. 23, No. 3, pp. 750–758, Jun. 1988). This will be explained later in detail.

In the above-described first prior art filter apparatus, however, since the operation mechanism of the voltage-controlled oscillator (VCO) of the master circuit is very complex, this filter apparatus including the VCO is also complex.

Additionally, in the above-described first prior art filter apparatus, parasitic capacitances in realized circuits cannot be ignored, so that it is impossible to maintain a precise relationship between the oscillation frequency of the VCO and the cut-off frequency or center frequency of the slave gm-C filter, particularly, in a low current type filter apparatus where the drive currents of the OTAs are small.

A second prior art filter apparatus formed on an LSI chip is constructed by a slave gm-C filter and a master circuit of a phase locked loop (PLL) type formed by a gm-C filter having the same structure as the slave gm-C filter (see: JP-9-320199-A). The master circuit receives a reference frequency signal and generates a control voltage for controlling the OTAs in the gm-C filter of the master circuit, so that the phase of the output signal of the gm-C filter of the master filter circuit is made equal to 90°. The control voltage is also used for controlling the slave gm-C filter, thus automatically tuning the frequency characteristics thereof. This also will be explained later in detail.

In the above-described second prior art filter apparatus, however, since the gm-C filter of the master filter circuit have the same or a similar structure to that of the gm-C slave filter, the operating frequency band of the gm-C filter of the master circuit is substantially the same as that of the slave gm-C filter. Therefore, the second prior art filter apparatus cannot be applied to a filter apparatus where the operating frequency band of a gm-C filter of a master circuit is different from that of a slave gm-C filter. Also, since the phase of the gm-C filter of the master circuit is required to be precisely 90° detected by a 90° phase detection circuit, the controllability is severe.

SUMMARY OF THE INVENTION

It is an object of the present invention to provide a simple filter apparatus including a slave gm-C filter and a master circuit for automatically tuning the frequency characteristics of the slave gm-C filter, with relaxed controllability.

According to the present invention, in a filter apparatus including a master circuit for receiving a reference frequency signal having a reference frequency to generate a control voltage and a slave gm-C filter formed by at least one OTA and at least one capacitor where the OTA of the slave gm-C filter is controlled by the control voltage for tuning a cut-off frequency or center frequency of the slave gm-C filter, the master circuit is constructed by a phase shifter formed by at least one OTA and at least one capacitor, the phase shifter being adapted to receive the reference frequency signal and change a phase of the reference frequency signal in accordance with the control voltage, a phase comparator adapted to compare a phase of an output signal of the phase shifter with a phase of the reference frequency signal to generate a phase error signal, and a loop filter adapted to exclude an AC component from the phase error signal to generate a DC component thereof as the control voltage. A phase locked loop of the master circuit is operated so that a loop gain thereof is maximum.

BRIEF DESCRIPTION OF THE DRAWINGS

The present invention will be more clearly understood from the description set forth below, as compared with the prior art, with reference to the accompanying drawings, wherein:

FIG. 8A is a circuit diagram illustrating a fifth example of the filter apparatus of FIG. 3 where an input resistor, a second-order LPF and a terminal resistor are used for the phase shifter of FIG. 3;

FIG. 9C is a graph showing the phase characteristics of the second-order HPF of FIG. 9A;

FIG. 10C is a graph showing the phase characteristics of the second-order BPF of FIG. 10A.

DESCRIPTION OF THE PREFERRED EMBODIMENT

Before the description of the preferred embodiment, the prior art filter apparatuses will be explained by referring to FIGS. 1 and 2.

Figure 1:
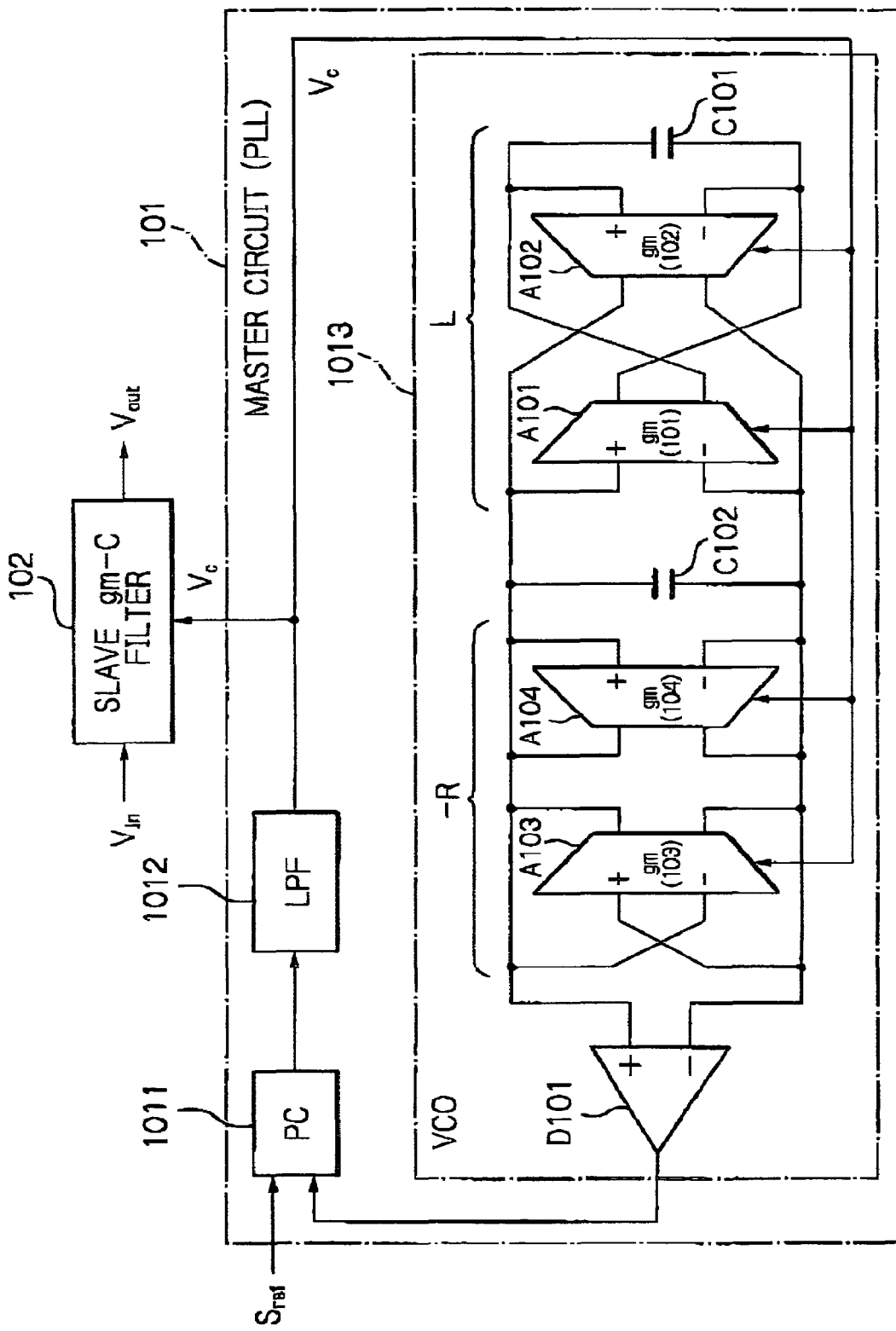
FIG. 1 is a circuit diagram illustrating a first prior art filter apparatus.

In FIG. 1, which illustrates a first prior art filter apparatus formed on an LSI, chip (see: F. Krummenacher et al. "A 4-MHz CMOS Continuous-Time Filter with On-Chip Automatic Tuning", IEEE J. so Solid-State Circuits, Vol. 23, No. 3, pp. 750–758, June 1988), reference numeral 101 designates a master circuit for receiving a reference frequency signal $S_{ref}$ having a reference frequency $f_{ref}$ to generate a control voltage $V_c$, and reference numeral 102 designates a slave gm-C filter for receiving an input voltage $V_{in}$ to generate an output voltage $V_{out}$. In this case, the transconductance values of the OTAs in the slave gm-C filter 102 are controlled by the control voltage $V_c$ to adjust the cut-off frequency or center frequency of the slave gm-C filter 102.

The master circuit 101 is a phase-locked loop (PLL) circuit which is constructed by a phase comparator 1011, a loop filter (LPF) 1012 and a voltage control oscillator (VCO) 1013. That is, the phase comparator 1011 detects a difference in phase between the reference frequency signal $S_{ref}$ and the output signal from the VCO 1013, so that this difference in phase is fed back via the LPF 1012 as the control voltage $V_c$ to the VCO 1013. Thus, the phase of the output signal of the VCO 1013 is brought close to that of the reference frequency signal $S_{ref}$.

The VCO 1013 is constructed by a capacitor C101, OTAs A101 and A102 having transconductance values gm(101) and gm(102), respectively, a capacitor C102, OTAs A103 and A104 having transconductance values gm(103) and gm(104), respectively, and a differential amplifier D101 for decreasing the secondary distortion. In this case, the OTAs A101 and A102 and the capacitor C101 form an equivalent inductance L in accordance with the Gyrator theory. Also, the equivalent inductance L and the capacitor C102 form an LC parallel resonator. Further, the transconductance values gm(103) and gm(104) of the OTAs A103 and A104 are determined to be gm(103)>gm(104), so that the OTAs A103 and A104 form a negative resistance (−R=−1/gm). Additionally, the input voltage range of the OTA A103 is narrower than that of the OTA A104 in order to limit the amplitude of the voltage controlled oscillator 1013.

In FIG. 1 since the drive currents of the OTAs A101, A102, A103 and A104 controlled by the control voltage $V_c$ are brought close to those of the OTAs in the slave gm-C filter 102 controlled by the control voltage $V_c$, the transconductance values gm(100), gm(102), gm(103) and gm(104) of the OTAs A101, A102, A103 and A104 are brought close to those of the OTAs of the slave gm-C filter 102. In this case, the capacitance values of the capacitors C101 and C102 of the VCO 1013 usually have a precise relationship with those of the capacitors of the slave gm-C filter 102. Thus, even when the characteristics of the entire filter apparatus of FIG. 1 change due to manufacturing process variations, temperature drift, and the like, the oscillation frequency $f_{VCO}$ of the VCO 1013 can have a precise relationship with the frequency characteristics such as a cut-off frequency or center frequency of the slave gm-C filter 102, so that the frequency characteristics of the slave gm-C filter 102 are automatically tuned in accordance with the reference frequency $f_{ref}$ of the reference frequency signal $S_{ref}$.

Note that, the master circuit 101, i.e., the PLL circuit is operated so that the oscillation frequency of the VCO 1013 is brought close to the reference frequency $f_{ref}$. In this case, the oscillation frequency of the VCO 1013 is represented by $$f_{VCO} = \{2 \cdot gm(101) - 2 \cdot gm(102)\}^{1/2} / \{2\pi \cdot (C101 \cdot C102)^{1/2}\} \quad (1)$$

where C101 and C102 also represent the capacitance values of the capacitors C101 and C102, respectively. The value "2" of the formula (1) means that the transconductance values gm for the OTAs are doubled by applying OTAs of a differential output type. The differential amplifier D101 is applied to transfer a differential signal to a single-ended one. In this case, if gm(101)=gm(102)=gm and C101=C102=C, then, $$f_{VCO} = 2 \cdot gm / (2\pi C) \quad (2)$$

Also, if 2·gm=1/R, then the formula (2) is replaced by $$f_{VCO} = 1/(2\pi CR) \quad (3)$$

In FIG. 1, note that a current controlled oscillator can be provided instead of the VCO 1013.

In the filter apparatus of FIG. 1, however, since the VCO 1013 is complex, the filter apparatus of FIG. 1 is also complex.

Additionally, in the filter apparatus of FIG. 1, the oscillation frequency $f_{VCO}$ of the VCO 1013 has to be within a stop band of the slave gm-C filter 102 in order to suppress the effect of the oscillation frequency of the VCO 1013 on the slave gm-C filter 102. However, if the oscillation frequency $f_{VCO}$ of the VCO 1013 is too far from the cut-off frequency or center frequency of the slave gm-C filter 102, the capacitance values of the capacitors C101 and C102 of the VCO 1013 will be smaller than those of the slave gm-C filter 102. As a result, parasitic capacitances of the realized circuits, which capacitances are not relatively smaller than the capacitance values of the capacitors C101 and C102, cannot be ignored, so that it is impossible to maintain the above-mentioned precise relationship between the oscillation frequency of the VCO 1013 and the cut-off frequency or center frequency of the slave gm-C filter 102, particularly, in a low current type filter apparatus where the drive currents of the OTAs are small.

Figure 2:
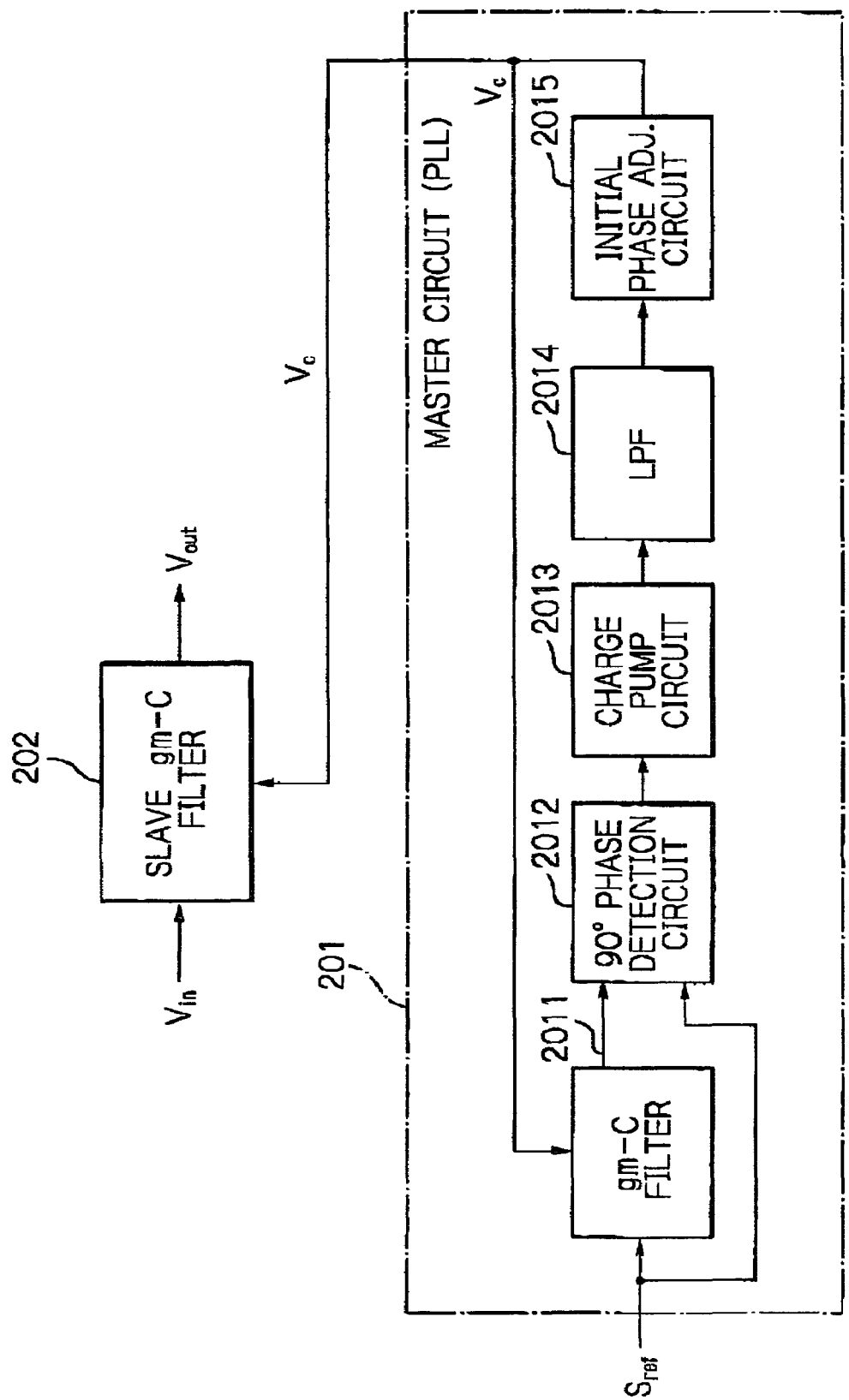
FIG. 2 is a circuit diagram illustrating a second prior art filter apparatus.

In FIG. 2, which illustrates a second prior art filter apparatus formed on an LSI chip (see; JP-9-320199-A), reference numeral 201 designates a master circuit for receiving a reference frequency signal $S_{ref}$ having a reference frequency $f_{ref}$ to generate a control voltage $V_C$, and reference numeral 202 designates a slave gm-C filter for receiving an input voltage $V_{in}$ to generate an output voltage $V_{out}$. Also in this case, the transconductance values of the OTAs in the slave gm-C filter 202 are controlled by the control voltage $V_c$ to adjust the cut-off frequency or center frequency of the slave gm-C filter 202.

The master circuit 201 is a PLL circuit which is constructed by a gm-C filter 2011 analogous to the slave gm-C filter, a 90° phase detection circuit 2012, a charge pump circuit 2013, a loop filter (LPF) 2014 and an initial phase adjustment circuit 2015 for adjusting the phase of the gm-C filter 2011 to a predetermined value such as 90°. That is, the 90° phase detection circuit 2012 detects a difference in phase between the reference frequency signal $S_{ref}$ and the output signal of the gm-C filter 2011, so that the 90° phase detection circuit 2012 generates a deviation signal showing a deviation of the difference in phase from 90°. Then, the charge pump circuit 2013 generates a current signal corresponding to the deviation signal. Then, the LPF 2014 integrates the current signal to generate a phase error signal, and transmits it to the initial phase adjustment circuit 2013. Finally, the initial phase adjustment circuit 2013 adds an adjustment amount corresponding to a difference between the characteristics of the slave gm-C filter 202 and desired characteristics to the phase error signal, so as to generate the control voltage $V_C$.

The control voltage $V_C$ is fed back to the gm-C filter 2011, and also, is transmitted to the slave gm-C filter 202. Thus, the phase of the output signal of the gm-C filter 2011 is brought close to a predetermined value such as 90° relative to that of the reference frequency signal $S_{ref}$.

In FIG. 2, since the gm-C filter 2011 is analogous to the slave gm-C filter 202, i.e., the gm-C filter 2011 has the same structure as that of the slave gm-C filter 202 or a similar structure to that of the slave gm-C filter 202, the cut-off frequency or center frequency of the slave gm-C filter 202 is brought close to the reference frequency $f_{ref}$ of the reference frequency signal $S_{ref}$.

In the filter apparatus of FIG. 2, however, the operating frequency band of the gm-C filter of the master circuit 201 is substantially the same as the operating frequency band of the slave gm-C filter 202. Therefore, the filter apparatus of FIG. 2 cannot be applied to a filter apparatus where the operating frequency band of a gm-C filter of a master circuit is different from the operating frequency band of a slave gm-C filter. Also, since the phase of the gm-C filter 2011 is required to be precisely 90°, the controllability is severe.

Figure 3:
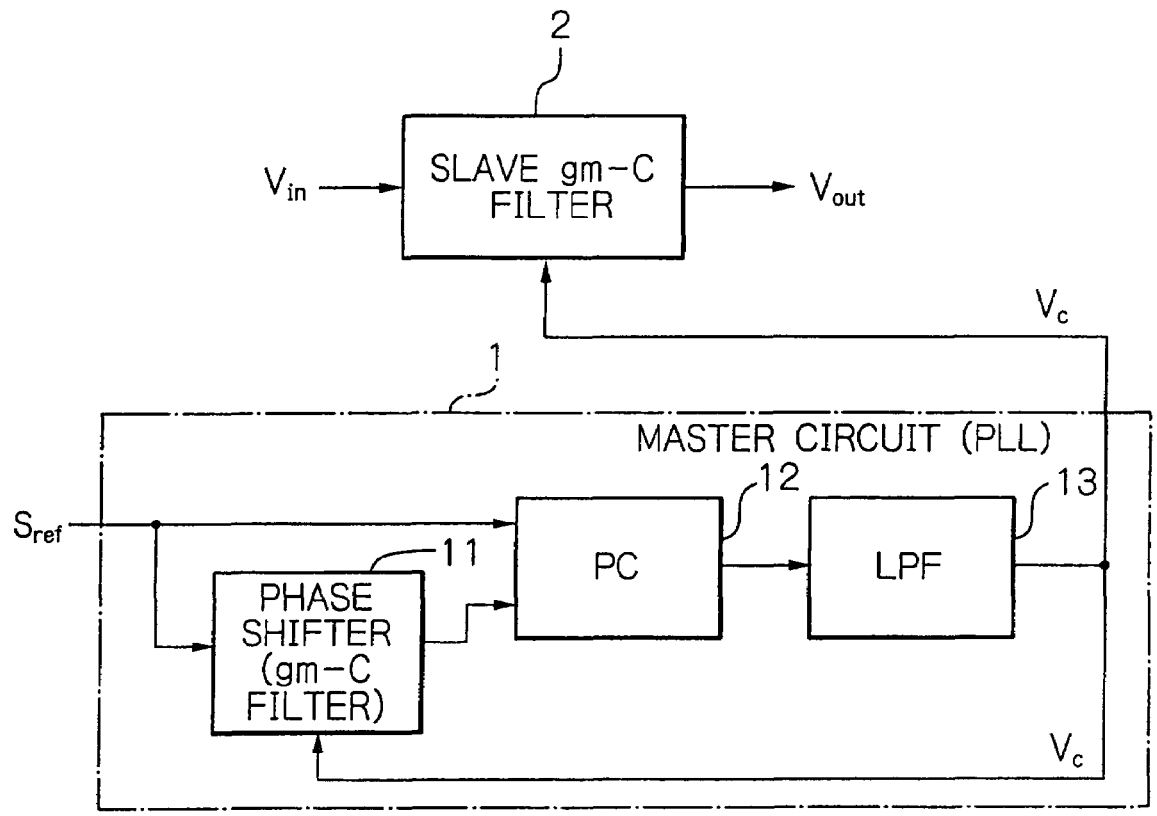
FIG. 3 is a circuit diagram illustrating an embodiment of the filter apparatus according to the present invention.

In FIG. 3, which illustrates an embodiment of the filter apparatus according to the present invention formed on an LSI chip, reference numeral 1 designates a master circuit for receiving a sinusoidal reference frequency signal $S_{ref}$ having a reference frequency $f_{ref}$ to generate a control voltage $V_C$, and reference numeral 2 designates a slave gm-C filter for receiving an input voltage $V_{in}$ to generate an output $V_{out}$. The slave gm-C filter 2 is controlled by the control voltage $V_C$ to adjust the cut-off frequency or center frequency of the slave gm-C filter 2.

The master circuit 1 is a PLL circuit that is constructed by a phase shifter 11 for receiving the reference frequency signal $S_{ref}$ to change the phase of the reference frequency signal $S_{ref}$, a phase comparator 12 for comparing the phase of the output signal of the phase shifter 11 with that of the reference frequency signal $S_{ref}$ to generate a phase error signal, and a loop filter (LPF) 13 for excluding an AC component signal from the phase error signal to generate a DC component thereof. As a result, this DC component signal is supplied as the control voltage $V_C$ to the phase shifter 11 and the slave gm-C filter 2.

Figure 3A:
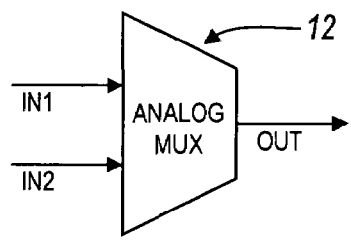
FIG. 3A is a schematic diagram of a two-input analog multiplexer for phase comparator 12 in FIG. 3.
Figure 3B:
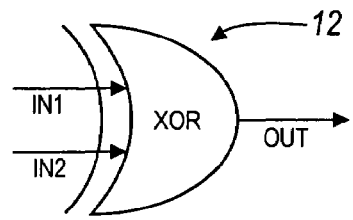
FIG. 3B is a schematic diagram of a two-input exclusive OR circuit for phase comparator 12 in FIG. 3.

In FIG. 3, the phase comparator 12 can be formed by a two-input analog multiplexer, as shown in FIG. 3A, or a two-input exclusive OR circuit, as shown in FIG. 3B. For example, if the phase comparator 12 is formed by a two-input exclusive OR circuit of FIG. 3B where the two input signals are both rectangular waves, when the difference in phase between them is 90°, the PLL circuit is in a locked state where the DC voltage component of an output signal is VDD/2 and the frequency of the output signal is twice that of the input signals.

Also, in FIG. 3, the phase shifter 11 is controlled by the control voltage $V_C$, so that the loop gain of the PLL circuit is made maximum. Therefore, the 90° phase detection circuit 2012 of FIG. 2 is not provided.

Figure 4:
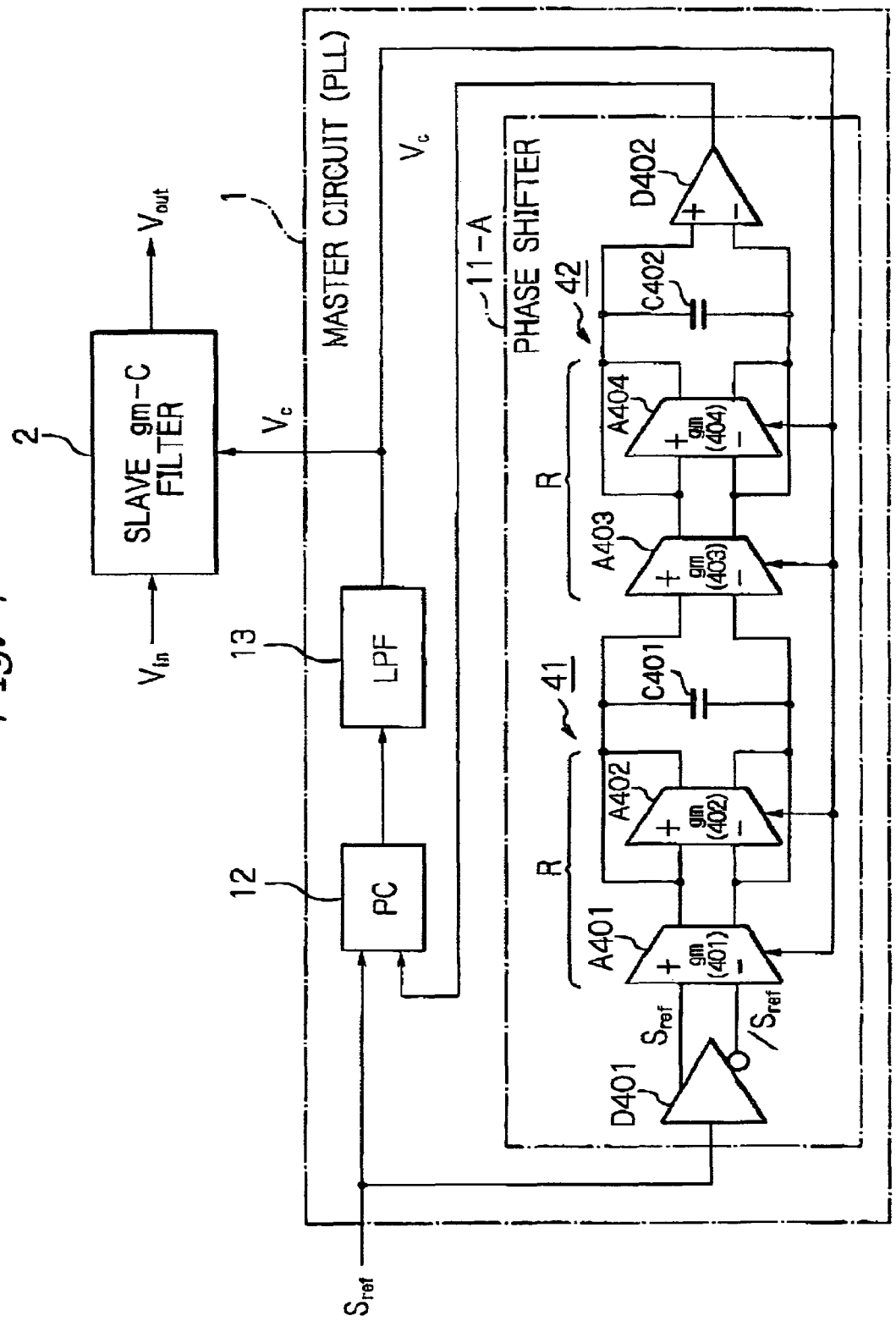
FIG. 4 is a circuit diagram illustrating a first example of the filter apparatus of FIG. 3 where first-order low pass filters (LPFs) are used for the phase shifter of FIG. 3.
Figure 5:
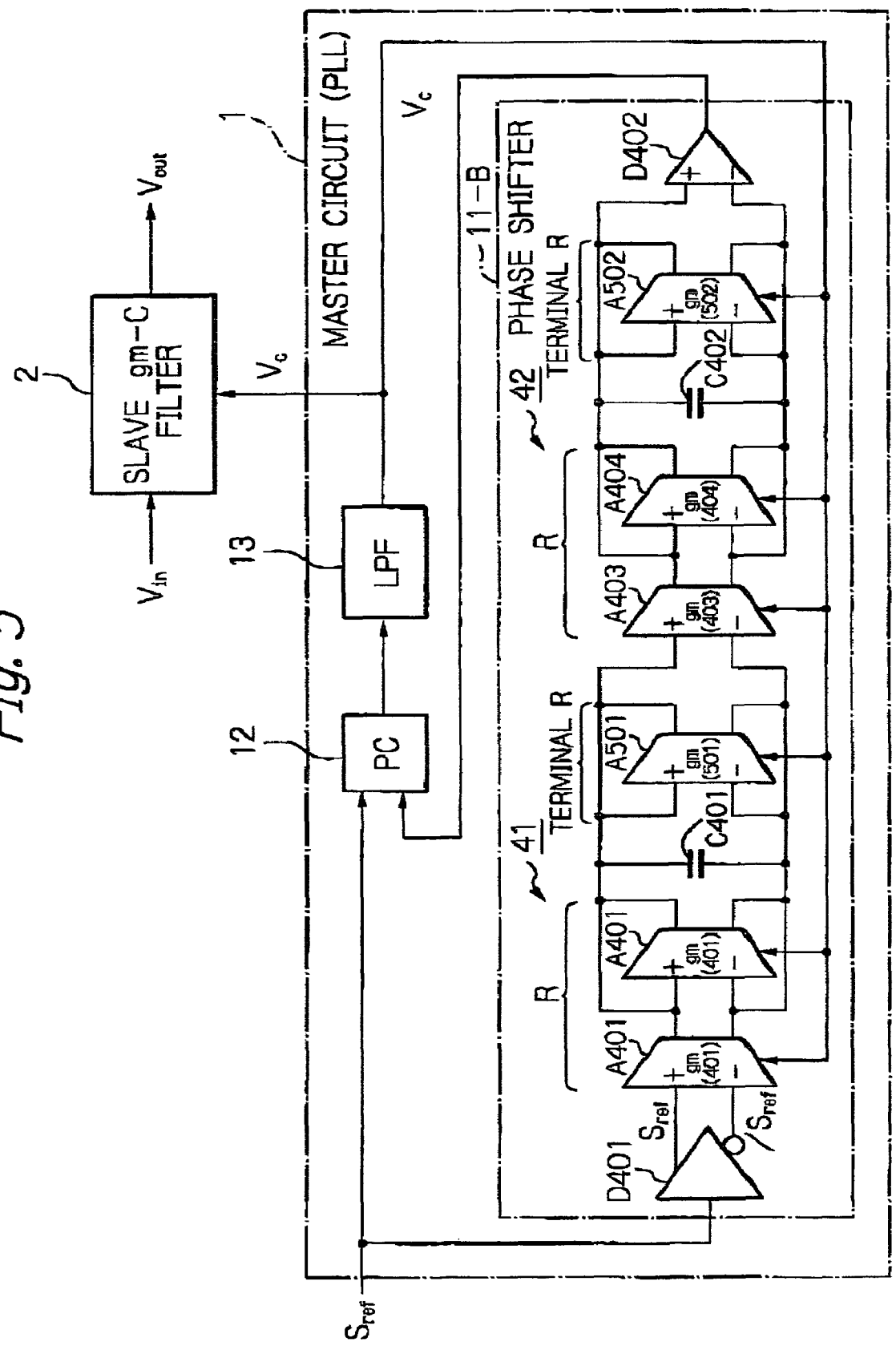
FIG. 5 is a circuit diagram illustrating a second example of the filter apparatus of FIG. 3 where LPFs with terminal resistors are used for the phase shifter of FIG. 3.
Figure 6:
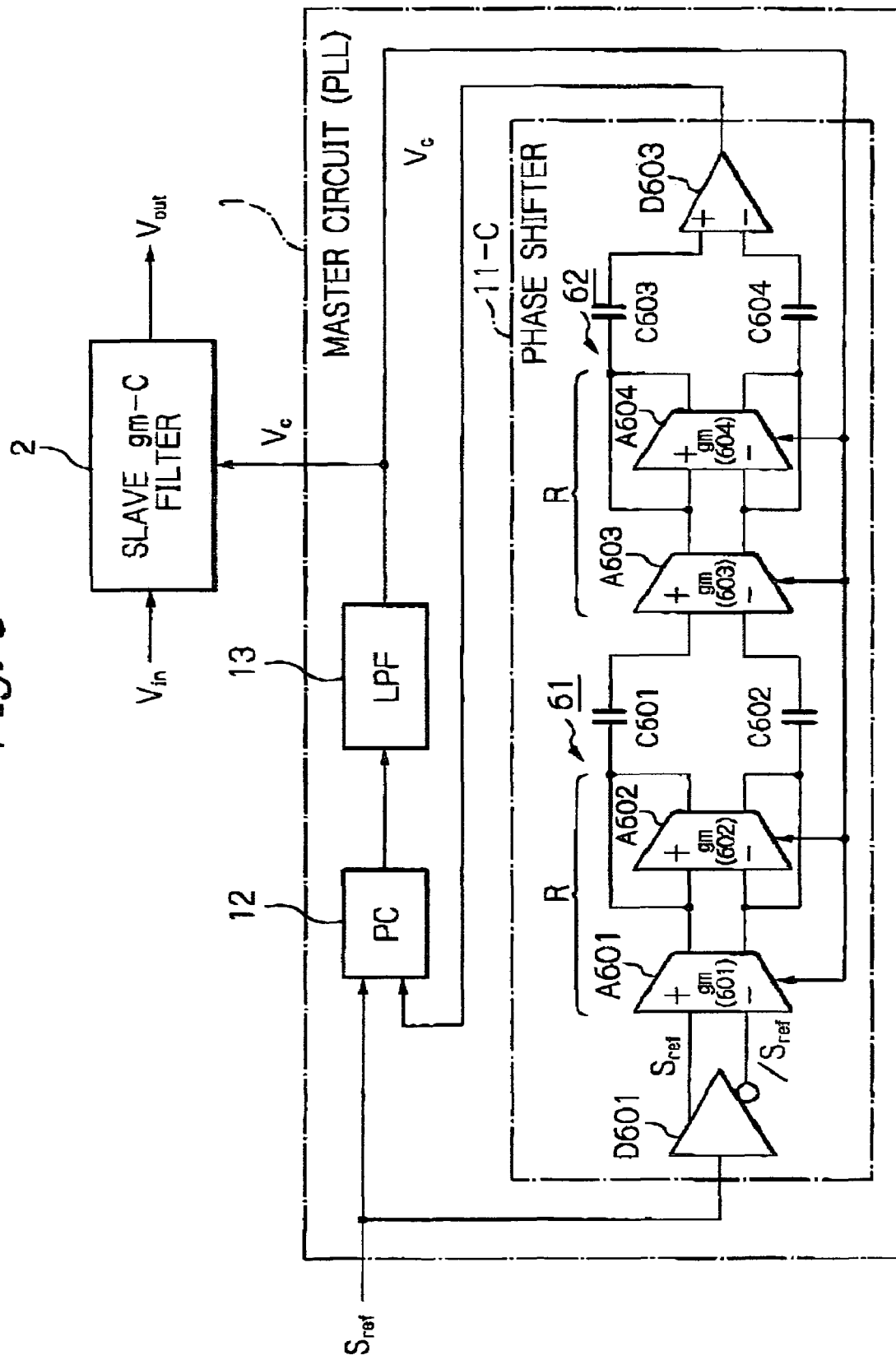
FIG. 6 is a circuit diagram illustrating a third example of the filter apparatus of FIG. 3 where first-order high pass filters (HPFs) are used for the phase shifter of FIG. 3.
Figure 7:
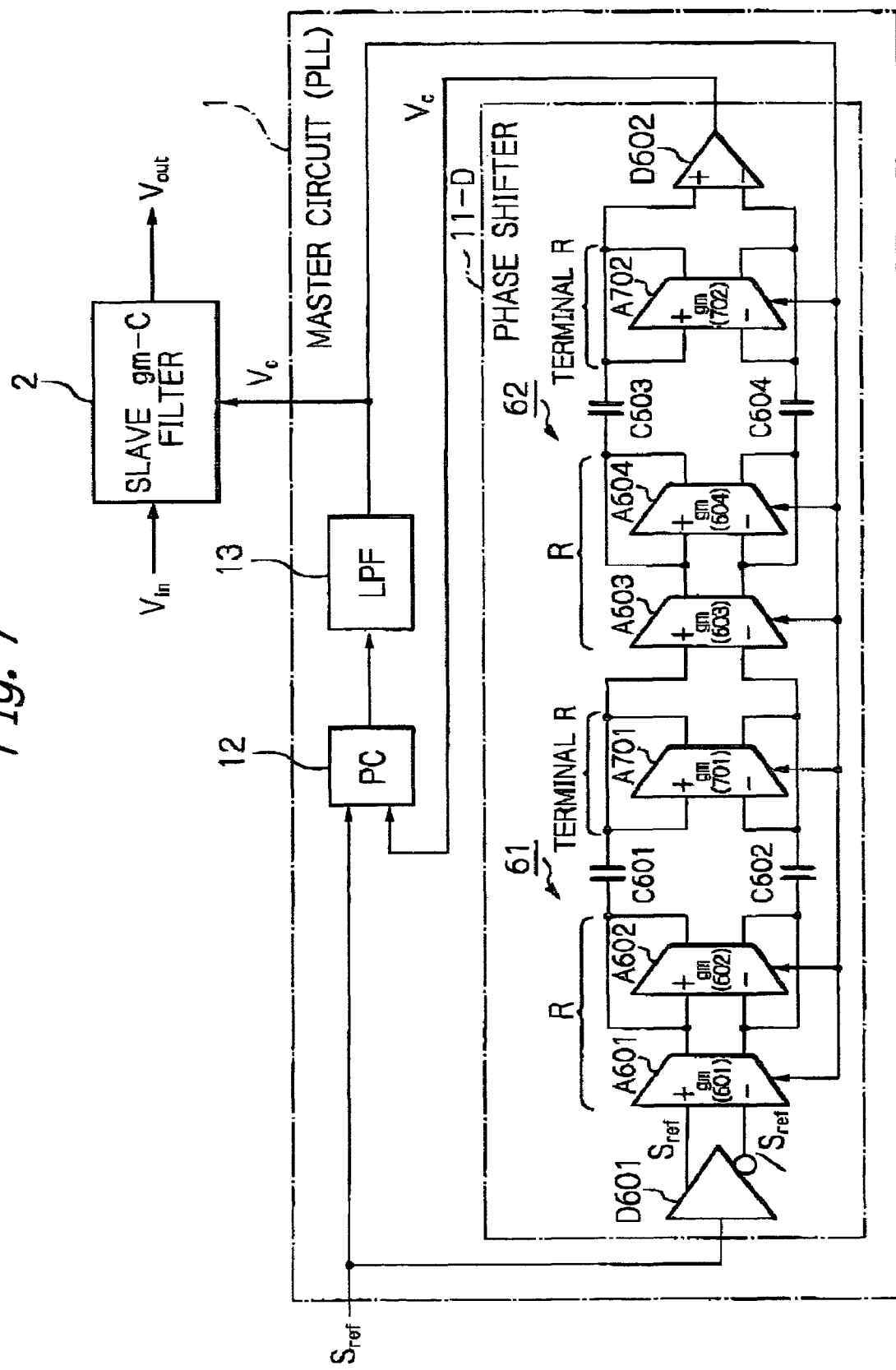
FIG. 7 is a circuit diagram illustrating a fourth example of the filter apparatus of FIG. 3 where HPFs with terminal resistors are used for the phase shifter of FIG. 3.
Figure 8B:
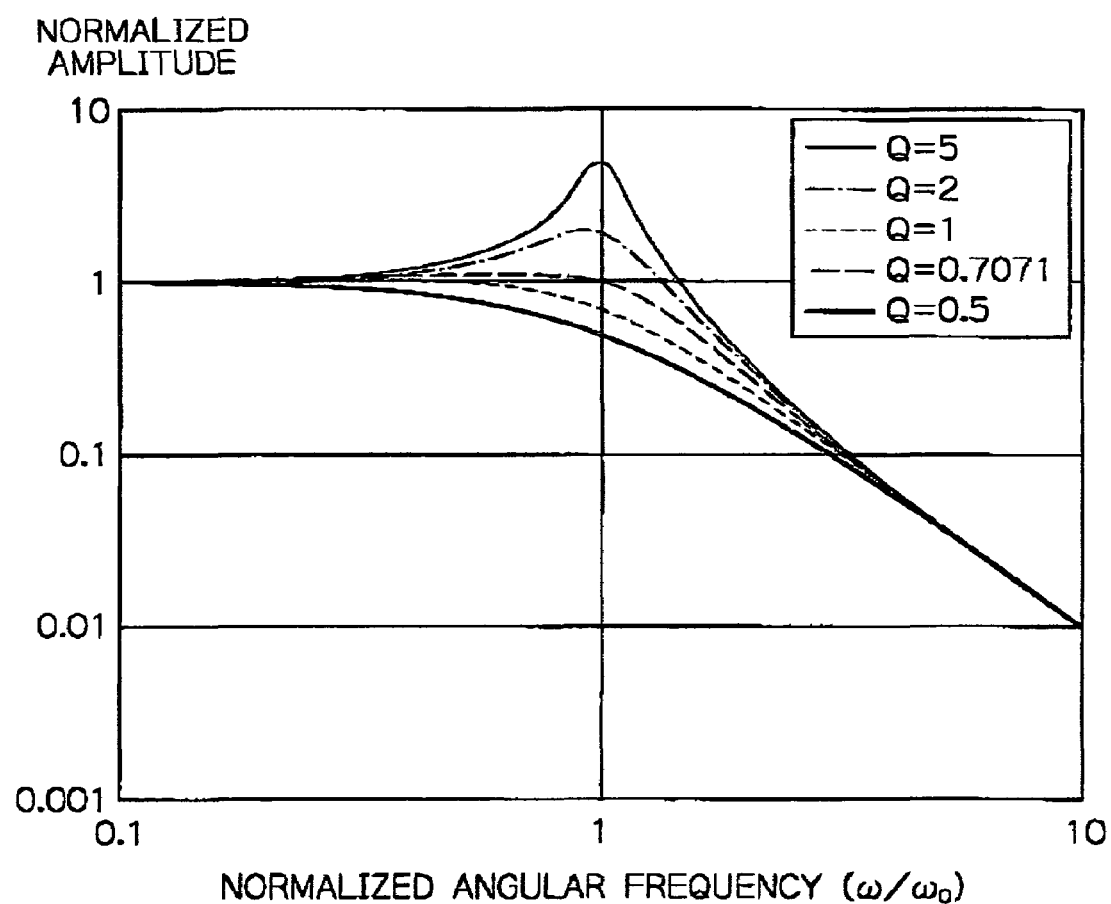
FIG. 8B is a graph showing the amplitude characteristics of the second-order LPF of FIG. 8A.
Figure 9A:
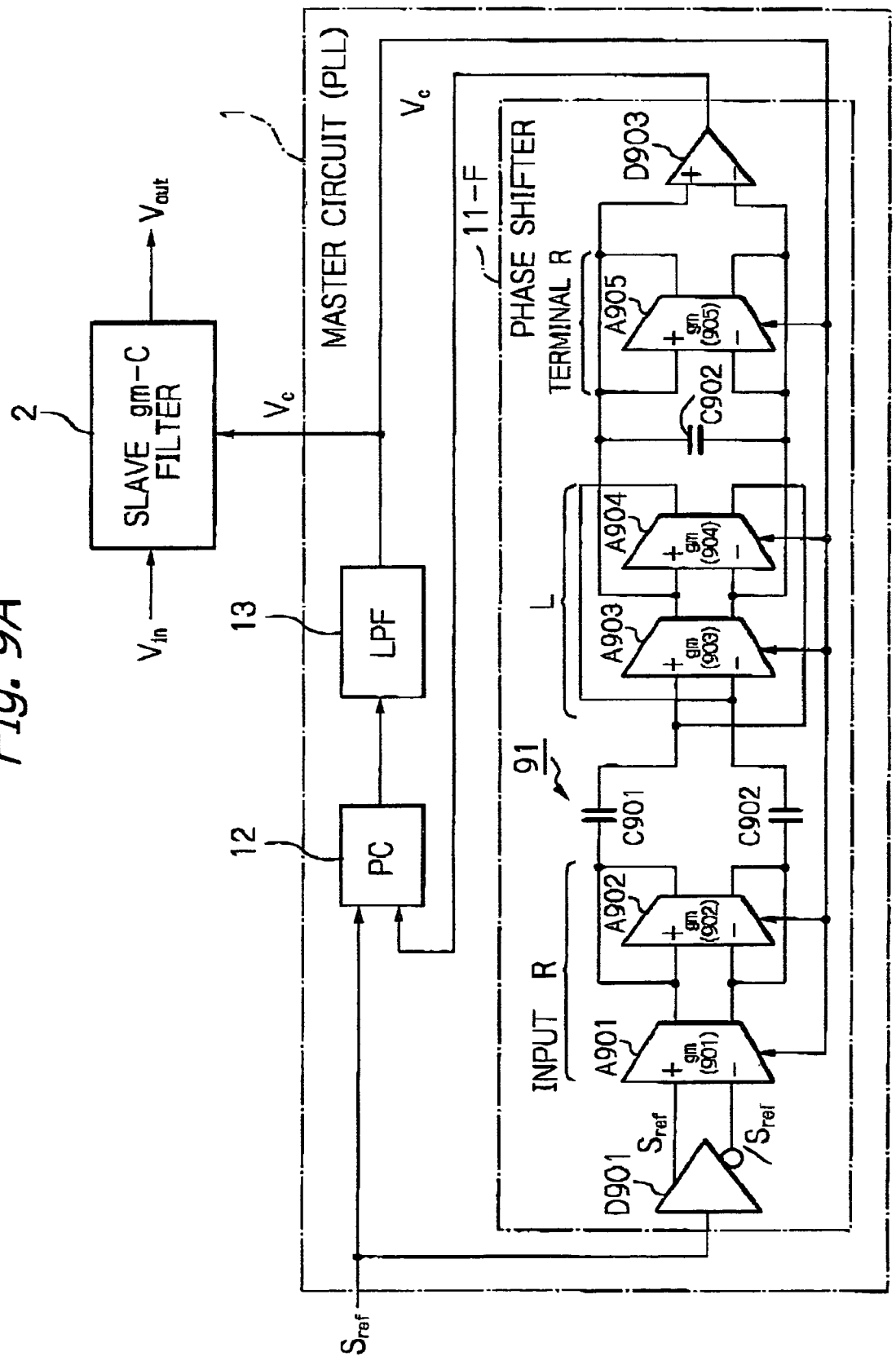
FIG. 9A is a circuit diagram illustrating a sixth example of the filter apparatus of FIG. 3 where an input resistor, a second-order HPF and a terminal resistor are used for the phase shifter of FIG. 3.
Figure 10A:
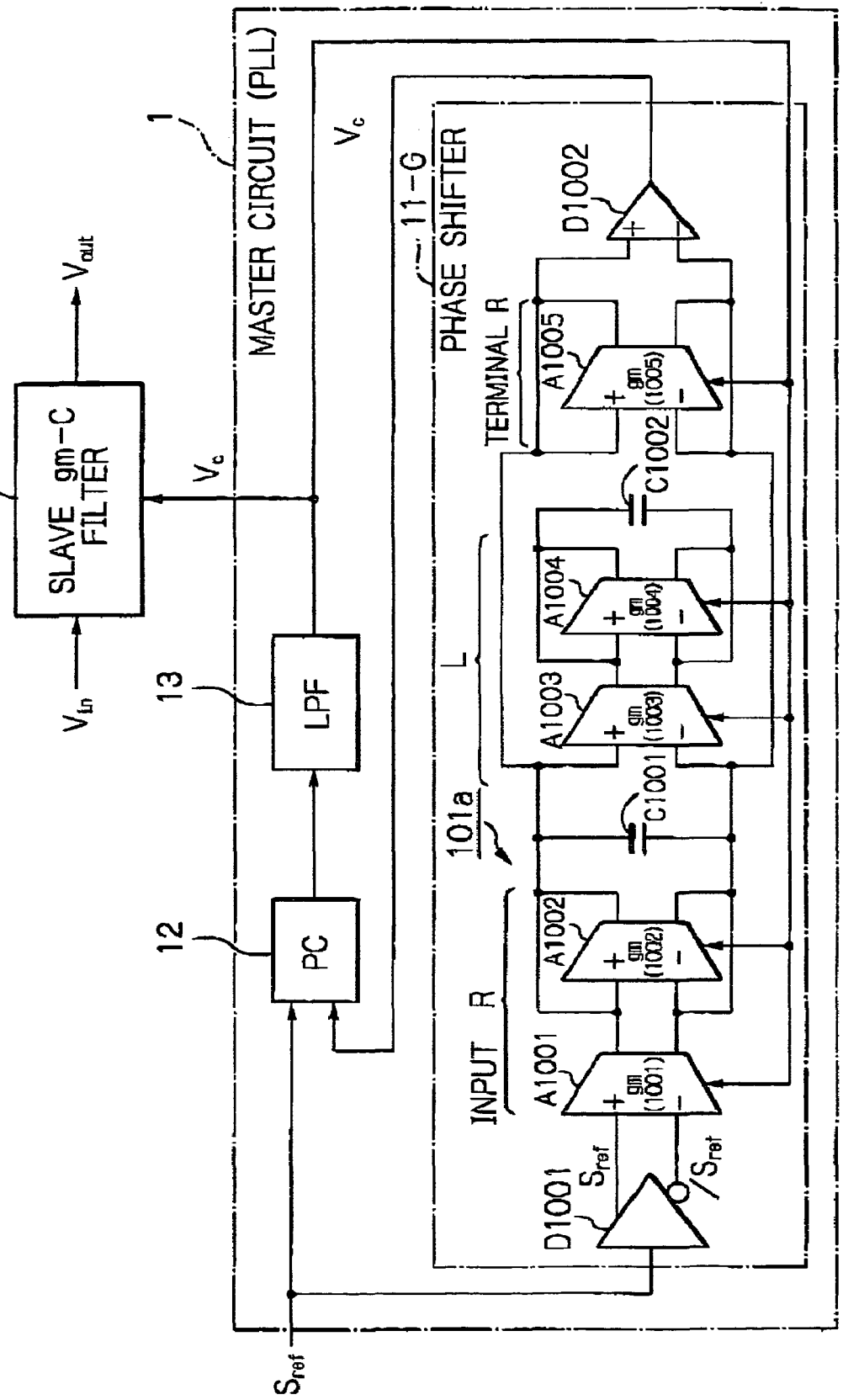
FIG. 10A is a circuit diagram illustrating a seventh example of the filter apparatus of FIG. 3 where an input resistor, a second-order BPF and a terminal resistor are used for the phase shifter of FIG. 3.

The phase shifter 11 is formed by a gm-C filter. In this case, the gm-C filter of the phase shifter 11 is constructed by a lower-order filter such as a first-order LPF as illustrated in FIGS. 4 and 5, a first-order HPF as illustrated in FIG. 6, a second-order LPF as illustrated in FIG. 7, a second-order LPF as illustrated in FIG. 8A, a second-order HPF as illustrated in FIG. 9A, or a second-order BPF as illustrated in FIG. 10A, which would decrease the manufacturing cost and the power consumption. On the other hand, the slave gm-C filter 2 can be formed by a higher-order filter as well as the above-mentioned lower-order filter. That is, the operating frequency band of the gm-C filter of the phase shifter 11 is not always the same as that of the slave gm-C filter 2.

Note that the larger the drive current flowing through an OTA, the smaller the transconductance value gm thereof. For example, if the OTA is formed by MOS transistors, the transconductance value gm thereof is proportional to the square root value of the drive current. Also, if the OTA is formed by bipolar transistors, the transconductance value gm thereof is proportional to the value of the drive current.

In FIG. 4, which illustrates a first example of the filter apparatus according to the present invention, a phase shifter 11-A is constructed by two cascaded first-order LPFs (41 and 42) and two amplifiers (D401 and D402); a pre-amplifier D401 for transferring the single-ended reference frequency signal $S_{ref}$ to a differential signal, and a post-amplifier D402 for obtaining a single-ended, phase-shifted reference frequency signal $S_{ref}$.

The first-order LPF 41 (42) is constructed by two OTAs A401 and A402 (A403 and A404) with transconductance values gm(401) and gm(402) (gm(403) and gm(404)), respectively, forming an equivalent resistance R $$(=1/gm=1/gm(401)=1/gm(402)(=1/gm(403)=1/gm(404))) \text{ and}$$

a capacitor C (=C401=C402), which is called an integrator. The transfer function H(s) of the first-order LPF 41 (42) is represented by $$H(s)=1/(1+sRC) \quad (4)$$

The drive currents of the OTAs A401, A402, A403 and A404 are controlled by the control voltage $V_C$.

Thus, in the first-order LPF 41 (42), the amplitude characteristics are −3 dB (=0.707) at a cut-off frequency $f_C$. When $f \leq f_C$, the amplitude characteristics gradually decrease, while, when $f > f_C$, the decrease rate of the amplitude characteristics is large, i.e., 6 dB/oct or 20 dB/dec. On the other hand, the phase characteristics is 45° (=π/4) at the cut-off frequency $f_C$. When $f \leq f_C$, the phase characteristics gradually change between 0° to 45°, while when $f > f_C$, the phase characteristics rapidly change between 45° to 90°.

The transfer function of the cascaded first-order LPFs 41 and 42 is represented by $$H(s) = \{1/(1 + sRC)\} \cdot \{1/(1 + sRC)\} \quad (5)$$
$$= 1/(1 + sRC)^2$$

Thus, in the cascaded first-order LPFs 41 and 42, the amplitude characteristics change on the basis of the square value of the frequency, while the phase characteristics change on the basis of the square value of the frequency between 0° to −180°. In this ease, when f=$f_C$, the amplitude characteristics are −6 dB, and the phase characteristics are −90° and their change is maximum.

Since the loop gain of a PLL circuit can be defined by the change of the phase characteristics thereof, the PLL circuit of FIG. 4 is locked around the cut-off frequency (f=$f_C$), i.e., when the phase of the phase shifter 11-A is around −90°, which would relax the controllability of the PLL circuit of FIG. 4 as well as the controllability of the slave gm-C filter 2.

In FIG. 5, a phase shifter 11-B is provided instead of the phase shifter 11-A of FIG. 4. In addition to the elements of the phase shifter 11-A of FIG. 4, the phase shifter 11-B includes two OTAs A501 and A502 with transconductance values gm(A501) and gm(A502) forming terminal resistors for the first-order LPFs 41 and 42, respectively.

In each of the first-order LPFs 41 and 42, since the terminal resistor formed by the OTA A501 (A502) is connected thereto, there is created an insertion loss of 6 dB.

Since, in amplifier including a gm-C filter where a bias condition is unchanged, a product GB of a gm-C filter, where G is a gain and B is an operating frequency band, is generally constant on the condition that the bias condition for the OTAs in a gm-C filter is unchanged and the master gm-C filter (the first-order LPFs 41 and 42) with the insertion loss of 6 dB caused by each of the terminal resistors formed by the OTAs (A501 and A502), the cut-off frequency for the master gm-C filter with the insertion loss of 6 dB becomes twice as high as that for the slave gm-C filter without insertion loss. As a result, even when the cut-off frequency of the slave gm-C filter 2 is a half of the reference frequency signal $S_{ref}$, the capacitance of the slave gm-C filter 2 can be about the same as that of the phase shifter 11-B. In this case, the amplitude characteristics in each of the first-order LPFs 41 and 42 are decreased by −9 dB (=−6 dB−3 dB), so that the amplitude characteristics of the entire first-order LPFs 41 and 42 are decreased by −18 dB (≈⅛). However, this does not affect the phase characteristics of −90° of the phase shifter 11-B around the cut-off frequency $f_C$.

In other words, the insertion loss of 6 dB caused by the terminal resistors formed by the OTAs A501 and A502 can have the capacitance values of the capacitors C401 and C402, so that parasitic capacitance values of a realized circuit hardly affect the first-order LPFs 41 and 42 associated with the terminal resistors.

According to the second example of FIG. 5, since the characteristics of the gm-C filter of the phase shifter 11-B can correspond to those of the slave gm-C filter 2 so that the parasitic capacitances of a realized circuit can be neglected, the characteristics of the filter apparatus can be suppressed in spite of manufacturing process variations, temperature drift and the like. Also, since the frequency characteristics of the phase shifter 11-B can be easily changed by the resistance ratio of the input resistor (the equivalent resistance R) to the terminal resistor in each of the first-order LPFs 41 and 42, the coincidence between the capacitance value of the phase shifter 11-B and the capacitance value of the slave gm-C filter 2 can be enhanced.

In FIG. 6, which illustrates a third example of the filter apparatus according to the present invention, a phase shifter 11-C is constructed by two cascaded first-order HPFs 61 and 62, a pre-amplifier D601 for transferring the single-ended reference frequency signal $S_{ref}$ to a differential signal, and a post-amplifier D602 for obtaining a single-ended, phase-shifted reference frequency signal $S_{ref}$.

The first-order HPF 61 (62) is constructed by two OTAs A601 and A602 (A603 and A604) with transconductance values gm(601) and gm(602) (gm(603) and gm(604)), respectively, forming an equivalent resistance $$R(=1/gm=1/gm\ (601)=1/gm(602)(=1/gm(603)=1/gm(604)))$$

and a capacitor C (=C601=C602), which is called a differentiator. The transfer function H(s) of the first-order HPF 61 (62) is represented by $$H(s)=sRC/(1+sRC) \quad (6)$$

The drive currents of the OTAs A601, A602, A603 and A604 are controlled by the control voltage $V_C$.

Thus, in the first-order HPF 61 (62), the amplitude characteristics are −3 dB (=0.707) at a cut-off frequency $f_C$. When $f \leq f_C$, the increase rate of the amplitude characteristics is large, i.e., 6 dB/oct or 20 dB/dec, while, when $f > f_C$, the amplitude characteristics gradually increase. On the other hand, the phase characteristics are 45° (=π/4) at the cut-off frequency $f_C$. When $f \leq f_C$, the phase characteristics gradually change between 90° to 45°, while when $f > f_C$, the phase characteristics rapidly change between 45° to 0°.

The transfer function of the cascaded is first-order HPFs 61 and 62 is represented by $$H(s) = \{sRC/(1+sRC)\} \cdot \{sRC/(1+sRC)\} \quad (7)$$
$$= sRC/(1+sRC)^2$$

Thus, in the cascaded first-order HPFs 61 and 62, the amplitude characteristics change on the basis 30 of the square value of the frequency, while the phase characteristics change on the basis of the square value of the frequency between 180° to 0°. In this case, when $f=f_C$, the amplitude characteristics are −6 dB, and the phase characteristics are 90° and their change is maximum.

Since the loop gain of a PLL circuit can be defined by the change of the phase characteristics thereof, the PLL circuit of FIG. 6 is locked around the cut-off frequency ($f=f_C$), i.e., when the phase of the phase shifter 11-C is around 90°, which would relax the controllability of the PLL circuit of FIG. 6 as well as the controllability of the slave gm-C filter 2.

In FIG. 7, a phase shifter 11-D is provided instead of the phase shifter 11-B of FIG. 6. In addition to the elements of the phase shifter 11-C of FIG. 6, the phase shifter 11-D includes two OTAs A701 and A702 with transconductance values gm(A701) and gm(A702) forming terminal resistors for the first-order HPFs 61 and 62, respectively.

In each of the first-order HPFs 61 and 62, since the terminal resistor formed by the OTA A701 (A702) is connected thereto, there is created an insertion loss of 6 dB.

Since, in an amplifier including a gm-C filter where a bias condition is unchanged, a product GB of a gm-C filter, where G is a gain and B is an operating frequency band, is generally constant on the condition that the bias condition for the OTAs in a gm-C filter is unchanged and the master gm-C filter (the first-order HPFs 61 and 62) with the insertion loss of 6 dB caused by each of the terminal resistors formed by the OTAs (A701 and A702), the cut-off frequency for the master gm-C filter with the insertion loss of 6 dB becomes twice as high as that for the slave gm-C filter without insertion loss. As a result, even when the cut-off frequency of the slave gm-C filter 2 is a half of the reference frequency signal $S_{ref}$, the capacitance of the slave gm-C filter 2 can be about the same as that of the phase shifter 11-D. In this case, the amplitude characteristics in each of the first-order HPFs 61 and 62 are decreased by −9 dB (=−6 dB−3 dB), so that the amplitude characteristics of the entire first-order HPFs 61 and 62 are decreased by −18 dB (≈⅛). However, this does not affect the phase characteristics of 90° of the phase shifter 11-D around the cut-off frequency $f_C$.

In other words, the insertion loss of 6 dB caused by the terminal resistors formed by the OTAs A701 and A702 can halve the capacitance values of the capacitors C601 and C602, so that parasitic capacitance values of a realized circuit hardly affect the first-order HPFs 61 and 62 associated with the terminal resistors.

According to the second example of FIG. 7, since the characteristics of the gm-C filter of the phase shifter 11-D can correspond to those of the slave gm-C filter 2 so that the parasitic capacitances of a realized circuit can be neglected, the characteristics of the filter apparatus can be suppressed in spite of manufacturing process variations, temperature drift and the like. Also, since the frequency characteristics of the phase shifter 11-D can be easily changed by the resistance ratio of the input resistor (the equivalent resistance R) to the terminal resistor in each of the first-order HPFs 61 and 62, the coincidence between the capacitance value of the phase shifter 11-D and the capacitance value of the slave gm-C filter 2 can be enhanced.

In FIG. 8A, which illustrates a fifth example of the filter apparatus according to the present invention, a phase shifter 11-E is constructed by a second-order LPF 81, a pre-amplifier D801 for transferring the single-ended reference frequency signal $S_{ref}$ to a differential signal, and a post-amplifier D802 for obtaining a single-ended, phase-shifted reference frequency signal $S_{ref}$.

The second-order LPF 81 is constructed by two OTAs A801 and A802 with transconductance values gm(801) and gm(802), respectively, forming an input resistor or an equivalent resistance R, a capacitor C801, two OTAs A803 and A804 with transconductance values gm(803) and gm(804), respectively, forming an inductance L, a capacitor C802, and an OTA 805 with a transconductance value gm(805) forming a terminal resistor. In this case, the second-order LPF is formed by the capacitor C801, the inductance L and the capacitor C802.

In order to simplify the description, if there is no insertion loss, the transfer function H(s) is 1 for a DC component, and the transfer function H(s) of the second-order LPF 81 of FIG. 8A is represented by $$H(s) = \omega_0^2/(s^2 + \omega_0 s/Q + \omega_0^2) \quad (8)$$

where $\omega_0$ is an angular frequency of a pole; and

Figure 8C:
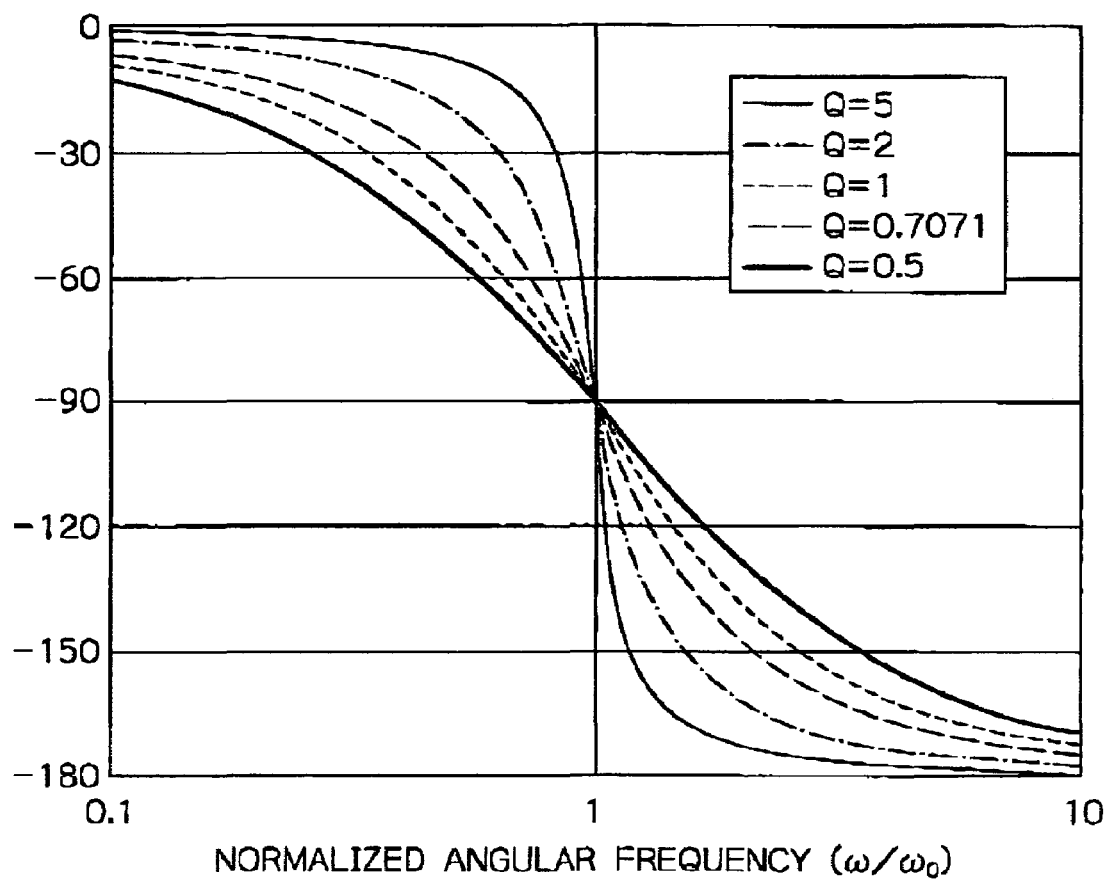
FIG. 8C is a graph showing the phase characteristics of the second-order LPF of FIG. 8A.

Q is a Q value of the pole. In this case, the amplitude characteristics of the second-order LPF 81 of FIG. 8A are shown in FIG. 8B, and the phase characteristics of the second-order LPF of FIG. 5A are shown in FIG. 8C.

Thus, in the second-order LPF, the phase characteristics change on a basis of the square value of the frequency between 0° to −180°. In this case, when $f=f_C=\omega_0/2\omega$, the phase characteristics are −90° and their change is maximum.

Since the loop gain of a PLL circuit can be defined by the change of the phase characteristics thereof, the PLL circuit of FIG. 8A is locked around the cut-off frequency ($f=f_C$) i.e., when the phase of the phase shifter 11-E is around −90°, which would relax the controllability of the PILL circuit of FIG. 8A as well as the controllability of the slave gm-C filter 2.

Even in FIG. 8A, the insertion loss of 6 dB caused by the terminal resistor formed by the OTA A805 can halve the capacitance value of the capacitor C802, so that parasitic capacitance values of a realized circuit hardly affect the second-order LPF 81 associated with the terminal resistor.

According to the fifth example of FIG. 8A, since the input resistor formed by the OTAs A801 and A802 doubles the frequency characteristics of the second-order LPF 81 as compared with those of the slave gm-C filter 2, the effect of parasitic capacitances associated with the layouts of the second-order LPF 81 and the slave gm-C filter 2 can be minimized. Also, when the minimum capacitance of the second-order LPF 81 is made equal to that of the slave gm-C filter 2, the effect of parasitic capacitances associated with the layouts of the second-order LPF 81 and the slave gm-C filter 2 can also be minimized. Therefore, since the characteristics of the gm-C filter of the phase shifter 11-E can correspond to those of the slave gm-C filter 2 so that the parasitic capacitances of a realized circuit can be neglected, the characteristics of the filter apparatus can be suppressed in spite of manufacturing process variations, temperature drift and the like. Also, since the frequency characteristics of the phase shifter 11-E can be easily changed by the resistance ratio of the input resistor (the equivalent resistance R) to the terminal resistor, the coincidence between the capacitance value of the phase shifter 11-E and the capacitance value of the slave gm-C filter 2 can be enhanced.

In FIG. 9A, which illustrates a sixth example of the filter apparatus according to the present invention, a phase shifter 11-F is constructed by a second-order HPF 91, a pre-amplifier D901 for transferring the single-ended reference frequency signal $S_{ref}$ to a differential signal, and a post-amplifier D902 for obtaining a single-ended, phase-shifted reference frequency signal $S_{ref}$.

The second-order HPF 91 is constructed by two OTAs A901 and A902 with transconductance values gm(901) and gm(902), respectively, forming an input resistor or an equivalent resistance R, capacitors C901 and C902, two OTAs A903 and A904 with transconductance values gm(903) and gm(904), respectively, forming an inductance L, a capacitor C903, and an OTA 905 with a transconductance value gm(900) forming a terminal resistor. In this case, the second-order HPF is formed by the capacitors C901 and C902, the inductance L and the capacitor C903.

Figure 9B:
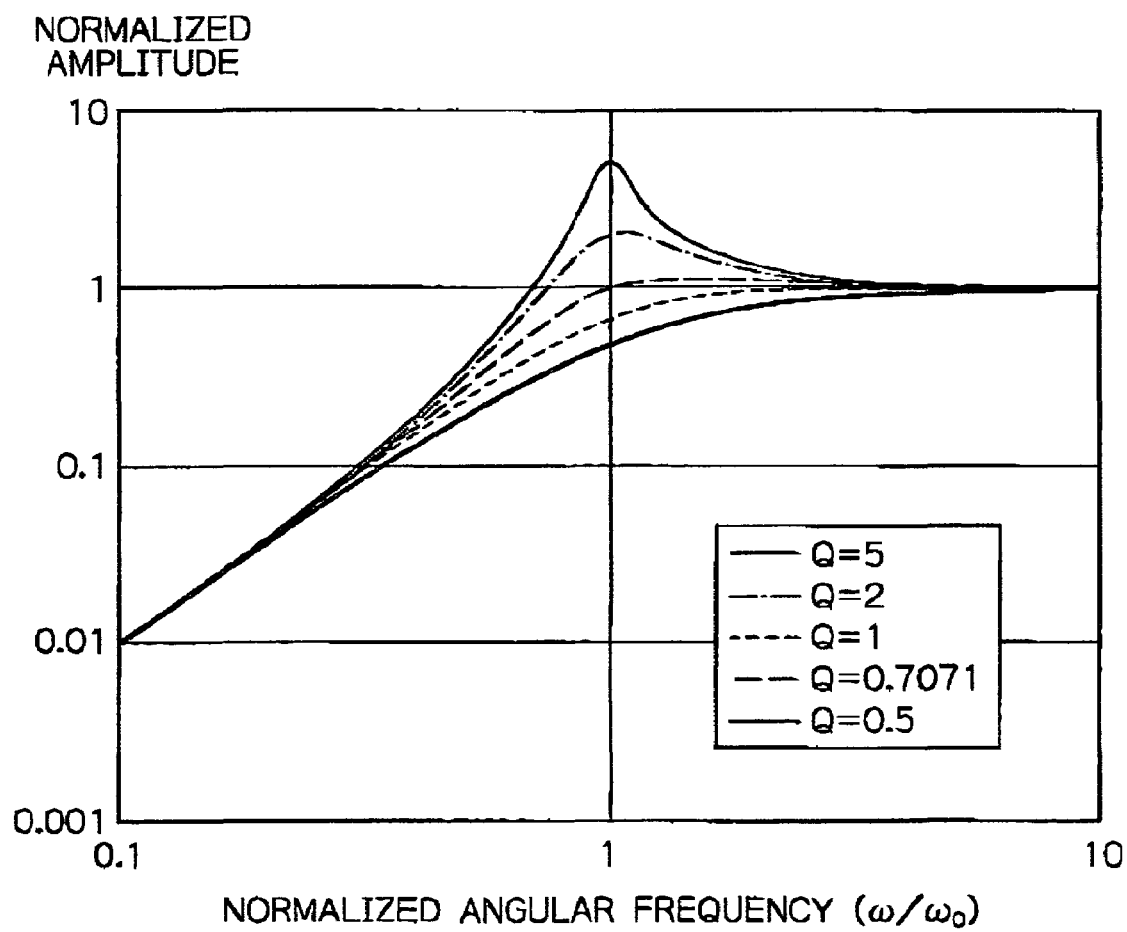
FIG. 9B is a graph showing the amplitude characteristics of the second-order HPF of FIG. 9A.

In order to simplify the description, if there is no insertion loss, the transfer function H(s) is 1 for an AC component of a frequency of ∞, and the transfer function H(s) of the second-order HPF 91 of FIG. 9A is represented by $$H(s)=s^2/(s^2+\omega_0 s/Q+\omega_0^2) \quad (9)$$

where $\omega_0$ is an angular frequency of a pole; and
Q is a Q value of the pole. In this case, the amplitude characteristics of the second-order HPF 91 of FIG. 9A are shown in FIG. 9B, and the phase characteristics of the second-order LPF of FIG. 9A are shown in FIG. 9C.

Thus, in the second-order HPF 91, the phase characteristics change on the basis of the square value of the frequency between 180° to 0°. In this case, when $f=f_C=\omega_0/2\pi$, the phase characteristics are 90° and their change is maximum.

Since the loop gain of a PLL circuit can be defined by the change of the phase characteristics thereof, the PLL circuit of FIG. 9A is locked around the cut-off frequency ($f=f_C$), i.e., when the phase of the phase shifter 11-F is around 90°, which would relax the controllability of the PLL circuit of FIG. 9A as well as the controllability of the slave gm-C filter 2.

Even in FIG. 9A, the insertion loss of 6 dB caused by the terminal resistor formed by the OTA A905 can halve the capacitance value of the capacitor C903, so that parasitic capacitance values of a realized circuit hardly affect the second-order HPF 91 associated with the terminal resistor.

According to the sixth example of FIG. 9A, since the input resistor formed by the OTAs A901 and A902 doubles the frequency characteristics of the second-order HPF 91 as compared with those of the slave gm-C filter 2, the effect of parasitic capacitances associated with the layouts of the second-order HPF 91 and the slave gm-C filter 2 can be minimized. Also, when the minimum capacitance of the second-order HPF 91 is made equal to that of the slave gm-C filter 2, the effect of parasitic capacitances associated with the layouts of the second-order HPF 91 and the slave gm-C filter 2 can also be minimized. Therefore, since the characteristics of the gm-C filter of the phase shifter 11-F can correspond to those of the slave gm-C filter 2 so that the parasitic capacitances of a realized circuit can be neglected, the characteristics of the filter apparatus can be suppressed in spite of manufacturing process variations, temperature drift and the like. Also, since the frequency characteristics of the phase shifter 11-F can be easily changed by the resistance ratio of the input resistor (the equivalent resistance R) to the terminal resistor, the coincidence between the capacitance value of the phase shifter 11-F and the capacitance value of the slave gm-C filter 2 can be enhanced.

In FIG. 10A, which illustrates a seventh example of the filter apparatus according to the present invention, a phase shifter 11-G is constructed by a second-order BPF 101a, a pre-amplifier D1001 for transferring the single-ended reference frequency signal $S_{ref}$ to a differential signal, and a post-amplifier D1002 for obtaining a single-ended, phase-shifted reference frequency signal $S_{ref}$.

The second-order BPF 101a is constructed by two OTAs A1000 and A1002 with transconductance values gm(1001) and gm(1002), respectively, forming an input resistor or an equivalent resistance R, a capacitor C1001, two OTAs A1003 and A1004 with transconductance values gm(1003) and gm(1004), respectively, forming an inductance L, a capacitor C1003, and an OTA 1005 with a transconductance value gm(1005) forming a terminal resistor. In this case, the second-order BPF is formed by the capacitor C1001, the inductance L and the capacitor C1003.

Figure 10B:
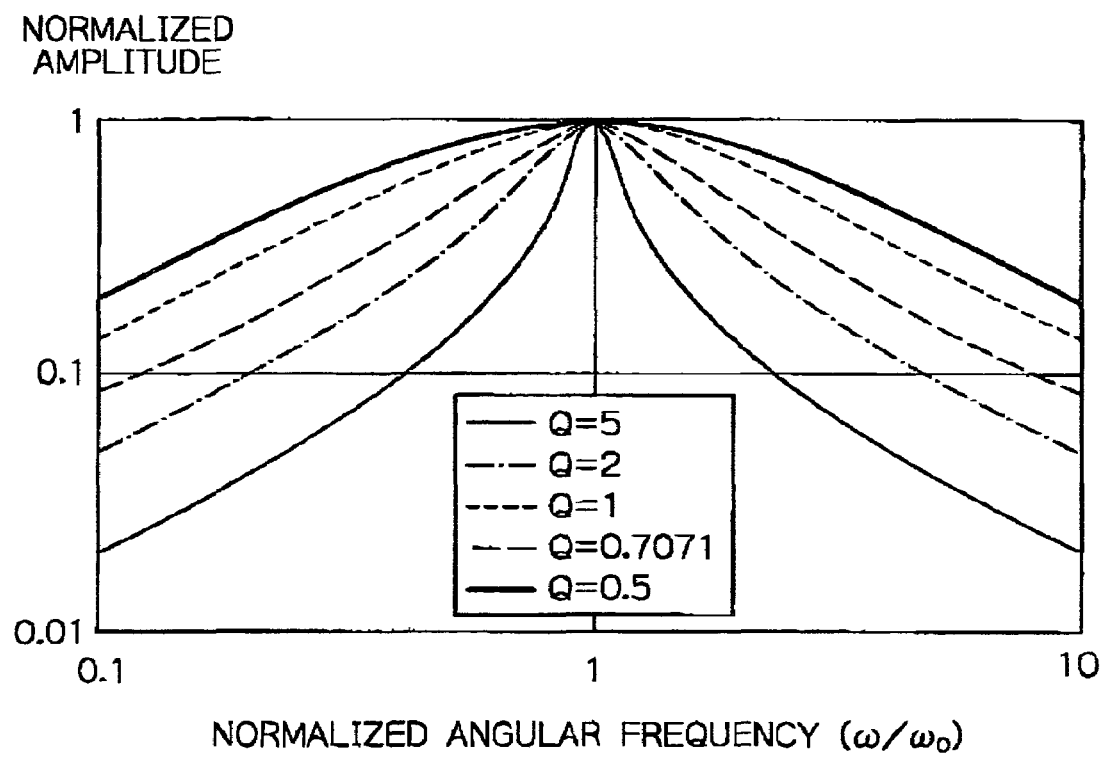
FIG. 10B is a graph showing the amplitude characteristics of the second-order BPF of FIG. 10A.

In order to simplify the description, if there is no insertion loss, the transfer function H(s) is 1 for a cut-off frequency $f_C$, and the transfer function H(s) of the second-order BPF 101a of FIG. 10A is represented by $$H(s)=(\omega_0 s/Q)/(s^2+\omega_0 s/Q+\omega_0^2) \quad (10)$$

where $\omega_0$ is an angular frequency of a pole; and
Q is a Q value of the pole. In this case, the amplitude characteristics of the second-order BPF 101a of FIG. 10A are shown in FIG. 10B, and the phase characteristics of the second-order BPF 101a of FIG. 10A are shown in FIG. 10C.

Thus, in the second-order BPF 111a, the phase characteristics change on a basis of the square value of the frequency between 90° to −90°. In this case, when $f=f_C=\omega_0/2\pi$, the phase characteristics are 0° and their change is maximum.

Since the loop gain of a PLL circuit can be defined by the change of the phase characteristics thereof, the PLL circuit of FIG. 10A is locked around the cut-off frequency ($f=f_C$), i.e., when the phase of the phase shifter 11-G is around 0°, which would relax the controllability of the PLL circuit of FIG. 10A as well as the controllability of the slave gm-C filter 2.

Even in FIG. 10A, the insertion loss of 6 dB caused by the terminal resistor formed by the OTA A1005 can halve the capacitance value of the capacitor C1002, so that parasitic capacitance values of a realized circuit hardly affect the second-order BPF 101a associated with the terminal resistor.

According to the seventh example of FIG. 10A, since the input resistor formed by the OTAs A1001 and A1002 doubles the frequency characteristics of the second-order BPF 101a as compared with those of the slave gm-C filter 2, the effect of parasitic capacitances associated with the layouts of the second-order BPF 101a and the slave gm-C filter 2 can be minimized. Also, when the minimum capacitance of the second-order BPF 101a is made equal to that of the slave gm-C filter 2, the effect of parasitic capacitances associated with the layouts of the second-order BPF 101a and the slave gm-C filter 2 can also be minimized. Therefore, since the characteristics of the gm-C filter of the phase shifter 11-G can correspond to those of the slave gm-C filter 2 so that the parasitic capacitances of a realized circuit can be neglected, the characteristics of the filter apparatus can be suppressed in spite of manufacturing process variations, temperature drift and the like. Also, since the frequency characteristics of the phase shifter 11-G can be easily changed by the resistance ratio of the input resistor (the equivalent resistance R) to the terminal resistor, the coincidence between the capacitance value of the phase shifter 11-G and the capacitance value of the slave gm-C filter 2 can be enhanced.

In FIGS. 8A, 9A and 10A, the characteristics of the second-order filter of each of the phase shifters 11-E, 11-F and 11-G should be comparable to those of the slave gm-C filter 2.

The second-order LPF, HPF and BPF, whose transfer functions are represented by formulae (8), (9) and (10), are realized by the following known methods;

(A) LCR ladder method; and (E) Biquad method.

Therefore, the following methods for realizing the second-order LPF, HPF or BPF using a gm-C filter could be considered:

(A) Method for emulating an LCR ladder filter; and (B) Biquad method.

In this case, the number of OTAs and the total capacitance which would directly affect the circuit current and the chip size, and the element sensitivity susceptibility should be considered.

According to the emulating method, since an LCR ladder filter per se has a low element sensitivity, the fluctuation of characteristics of the filter caused by manufacturing process variations can be suppressed. This feature is particularly effective against unpredictable process parameter variations and temperature fluctuations.

In gm-C filter application, OTAs are generally used in differential in order to suppress the second-order distortions. However, in the emulating method, the number of OTAs is increased as compared with that in the biquad method. Particularly, when an input resistor and a terminal resistor are provided in a realized filter, the number of OTAs is increased or the drive current of an initial stage OTA is increased to increase the transconductance value thereof, to decrease the insertion losses caused by the input resistor and the terminal resistor.

On the other hand, in the biquad method, a cascaded biquad filter is more popular because any filter can be realized by using the cascaded biquad filter whose transfer function is represented by a quotient of two polynomial equations where the degree of a polynomial equation in the denominator is equal to or larger than that of a polynomial equation in the numerator. Therefore, if a realized biquad filter is of a differential type, the same biquad block is repeated without a lot of alternations, thus simplifying the layout of the realized biquad filter. This biquad technique is particularly effective in a programmable filter for digitally controlling specific zero points and poles to desired values.

Also, although a realized biquad filter has an input resistor, the realized biquad filter has no terminal resistor so that there is no insertion loss. Therefore, no additional circuits are required in an initial stage of the realized biquad filter. Note that, if there is an insertion loss of 6 dB caused by a terminal resistor, an additional OTA is required to be in parallel with an OTA in an initial stage of a realized filter in order to obtain the twice transconductance value of that of an OTA.

Further, as stated above, since a realized biquad filter has no terminal resistor which is formed by an OTA, the number of OTAs can be minimized. For example, a second-order gm-C LPF realized by the biquad method requires six OTAs, while a second-order gm-C LPF realized by the emulating method requires seven OTAs in the case of 6 dB insertion loss and eight OTAs in the case of 0 dB insertion loss.

Further, since a principle where a product (GB) of a gain (G) and a frequency band (B) under a definite bias condition is definite is also applied to gm-C filters, there is a difference in frequency characteristics between gm-C filters realized by applying the emulating method and ones realized by applying the biquad method. That is, even under a condition wherein OTAs have definite drive currents, the operating frequency band of a gm-C filter with 6 dB insertion loss realized by applying the emulating method is considered to be about twice as wide as that of a gm-C filter with 0 dB insertion loss realized by applying the biquad method. For example, under a condition wherein the number of capacitors having the same capacitance value are provided, the cut-off frequency of a second-order Butterworth LPF realized by applying the emulating method is about twice as high as that of a second-order Butterworth LPF realized by applying the biquad method.

Otherwise, when the cut-off frequency of a second-order Butterworth LPF having an input resistor and a terminal resistor with 6 dB insertion loss realized by applying the emulating method as illustrated in FIG. 8A is made equivalent to that of a second order Butterworth LPF having an input resistor and no terminal resistor with 0 dB insertion loss realized by applying the biquad method, the capacitance of the first capacitor (see: C801 of FIG. 8A) is about the same as that of the second capacitor (see: C802 of FIG. 8A) in the former LPF (C801=C802), but the capacitance of the first capacitor (see: C801 of FIG. 8A) is about twice as that of the second capacitor (see; C802 of FIG. 8A) in the latter LPF (C801/2=C802). Thus, when the insertion loss is switched from 6 dB by applying the emulating method to 0 dB by applying the biquad method, the capacitance value of a capacitor connected to the terminal resistor by applying the emulating method becomes half. It is still valid for higher-order gm-C filters to be the same as the second-order gm-C filters.

When the capacitance of a capacitor connected to the terminal resistor becomes half, the capacitance of this capacitor serves as a minimum capacitor in a realized gm-C filter, so that parasitic capacitances of connections associated with the layout of OTAs would affect the characteristics of the realized filter.

In a Butterworth gm-C filter formed by OTAs having substantially the same transconductance value where the insertion loss is 6 dB, the larger the order, the larger the ratio (CMAX/CMIN) of a maximum capacitance (CMAX) to a minimum capacitance (CMIN). In this case, this ratio is not larger than ⅔ of the order. On the other hand, in the Butterworth gm-C filter formed by OTAs having substantially the same transconductance value where the insertion loss is 0 dB, the ratio (CMAX/CMIN) of a maximum capacitance (CMAX) to a minimum capacitance (CMIN) is larger than the degree. Therefore, a capacitance ratio of these two ratios is between 1.69 and 2. Thus, when the insertion loss is switched from 6 dB to 0 dB, the capacitance ratio is increased to between 1.69 and 2, so that parasitic capacitances of connections associated with the layout of OTAs would affect the characteristics of the realized filter.

Even if the order of the gm-C filter of the phase shifter 11-E, 11-F or 11-G is different from that of the slave gm-C filter 2, when the cut-off frequency of the gm-C filter of the phase shifter 11-E, 11-F or 11-G is set within the frequency band of the slave gm-C filter 2, and the gm-C filter of the phase shifter 11-E, 11-F or 11-G and the slave gm-C filter 2 are both of the same type such as a second-order LPF, a second-order HPF or a second-order BPF, the above-mentioned parasitic capacitance are expected to be so small that they can be neglected.

On the other hand, when the cut-off frequency of the gm-C filter of the phase shifter 11-E, 11-F or 11G is not set within the frequency band of the slave gm-C filter 2, the above-mentioned parasitic capacitances have to be considered. Generally, the reference frequency $f_{ref}$ of the reference frequency signal $S_{ref}$ is set within a stop band of the slave gm-C filter 2 to suppress the clock-through effect of the reference frequency $f_{ref}$ on the slave gm-C filter 2, thus enhancing a signal-to-noise (S/N) ratio of the slave gm-C filter 2. As a result, the degradation of characteristics of the slave gm-C filter 2 can be avoided. However, if the cut-off frequency of the gm-C filter of the phase shifter 11-E, 11-F or 11-G is much higher than the frequency band of the slave gm-C filter 2, the characteristics of the OTAs of the gm-C filter of the phase shifter 11-E, 11-F or 11-G have to be comparable to those of the OTAs of the slave gm-C filter 2, that is, the capacitance values of the capacitors of the gm-C filter of the phase shifter 11-E, 11-F or 11-G have to be smaller than those of the slave gm-C filter 2, so that parasitic capacitances associated with the layout of the OTAs of the realized gm-C filter cannot be ignored.

In order to compensate for the above-mentioned enhanced parasitic capacitances due to the higher cut-off frequency of the gm-C filter of the phase shifter 11-E, 11-F or 11-G, the transconductance values gm of the OTAs of the gm-C filter of the phase shifter 11-E, 11-F or 11-G are considered to be increased in response to the higher cut-off frequency thereof by increasing drive currents flowing through the OTAs or by increasing the number of OTAs forming the gm-C filter. However, since the transconductance value gm of an OTA formed by MOS transistors is proportional to the square root value of a drive current flowing therethrough, if the drive current becomes four times, the transconductance value gm of the OTA becomes only twice, and if the drive current becomes nine times, the transconductance value gin of the OTA becomes only three times. On the other hand, if the number of OTAs forming the gm-C filter becomes multiple times, the transconductance gm of the gm-C filter becomes also multiple times. In this case, however, since parasitic capacitances associated with the layout of the OTAs become also multiple times, these parasitic capacitances cannot be ignored.

Contrary to this, since in the slave gm-C filter 2 is formed by a single OTA which has a relatively large capacitance due to the low frequency band, parasitic capacitances associated with the layout of the OTA are much smaller than that of the OTA per se, so that the parasitic capacitances can be neglected.

Particularly, as the drive currents of OTAs have been decreased in order to decrease the power consumption, the transconductance values gm of the OTAs have been decreased, and therefore, the capacitances of the OTAs have been decreased. As a result, the effect of the parasitic capacitances associated with the layout of the OTAs of the gin-C filter of the phase shifter 11-E, 11-F or 11-G on the slave gm-C filter 2 has been enhanced. Above all, when the reference frequency $f_{ref}$ of the reference frequency signal $S_{ref}$ is higher, it is more difficult for the characteristics of the gm-C filter of the phase shifter 11-E, 11-F or 11-G to be kept comparable to those of the slave gm-C filter 2, particularly, in a low current type where the drive currents are small.

In view of the foregoing, when one of the cut-off frequency of the gm-C filter of the phase shifter 11-E, 11-F or 11-G and the frequency band of the slave gm-C filter 2 is made to be about twice the other, the emulating method and the biquad method are applied to the gm-C filter of the phase shifter 11-E, 11-F or 11-G and the slave gm-C filter 2, respectively. Otherwise, the emulating method with an insertion loss of 6 dB, is applied to the gm-C filter of the phase shifter 11-E, 11-F or 11-G, and the biquad method with an insertion loss of 0 dB is applied to the slave gm-C filter 2. As a result, even if the same OTAs having the same drive current are used, the capacitance value of the gm-C filter of the phase shifter 11-E, 11-F or 11-G is about the same as that of the slave gm-C filter 2.

Since the effect of parasitic capacitances associated with the layout of a realized filter is enhanced when the capacitance of the realized filter is small, when the minimum capacitance value of a gm-C filter of the phase shifter 11-E, 11-F or 11-G is made equivalent to the minimum capacitance value of the slave gm-C filter 2, the effect of parasitic capacitances associated with the layout of OTAs of the gm-C filters can be minimized. Thus, the characteristics of the second-order gm-C LPF, HPF or BPF can be comparable to those of the slave gm-C filter 2, and therefore, the fluctuation of characteristics of the filter apparatus due to manufacturing process variations, temperature drift and the like can be suppressed.

In the above-described embodiment, all the OTAs of the phase shifter 11 are controlled by the control voltage of the LPF 13. However, at least one of the OTAs of the phase shifter 11 can be controlled by the control voltage of the LPF 13.

As explained hereinabove, according to the present invention, the controllability of the filter apparatus can be relaxed.

The invention claimed is:

1. A filter apparatus comprising:
   a master circuit for receiving a reference frequency signal having a reference frequency to generate a control voltage; and
   a slave gm-C filter comprising at least one first operational transconductance amplifier and at least one first capacitor, the operational transconductance amplifier of said slave gm-C filter being controlled by said control voltage to tune one of a cut-off frequency and a center frequency of said slave gm-C filter,
   said master circuit comprising:
   a phase shifter comprising a second order am-C filter including at least two operational transconductance amplifiers forming an inductance, said phase shifter being adapted to receive said reference frequency signal and change a phase of said reference frequency signal in accordance with said control voltage;
   a phase comparator connected to said phase shifter, said phase comparator being adapted to compare a phase of an output signal of said phase shifter with said phase of said reference frequency signal to generate a phase error signal; and
   a loop filter, connected to said phase comparator, said loop filter being adapted to exclude an AC component from said phase error signal to generate a DC component thereof as said control voltage,
   a phase locked loop of said master circuit being operated so that a loop gain thereof is maximum.

2. The filter apparatus as set forth in claim 1, wherein an operating frequency band of said phase shifter is different from an operating frequency band of said slave gm-C filter.

3. The filter apparatus as set forth in claim 2, wherein said phase shifter comprises:
   a lower-order gm-C filter than said slave gm-C filter.

4. The filter apparatus as set forth in claim 1, wherein said phase shifter further comprises:
   an input resistor connected to said second order gm-C filter.

5. The filter apparatus as set forth in claim 4, wherein said second-order gm-C filter comprises:
   a second-order gm-C high pass filter.

6. The filter apparatus as set forth in claim 4, wherein said second-order gm-C filter comprises:
   a second-order gm-C band pass filter.

7. The filter apparatus as set forth in claim 4, wherein said input resistor comprises:
   two operational transconductance amplifiers.

8. The filter apparatus as set forth in claim 4, wherein said phase shifter further comprises:
   a terminal resistor connected to said second-order gm-C filter.

9. The filter apparatus as set forth in claim 8, wherein said terminal resistor comprises:
   an operational transconductance amplifier.

10. The filter apparatus as set forth in claim 1, wherein the phase comparator comprises:
    a two-input analog multiplexer.

11. The filter apparatus as set forth in claim 1, wherein the phase comparator comprises:
    a two-input exclusive OR circuit.

12. The filter apparatus as set forth in claim 1, wherein said phase shifter comprises:
    an input resistor; and
    a capacitor connected to said input resistor.

13. The filter apparatus as set forth in claim 12, wherein said input resistor comprises:
    two cascaded first-order high pass filters.

14. The filter apparatus as set forth in claim 13, further comprising:
    two terminal resistors each connected to one of said first-order high pass filters.

15. The filter apparatus as set forth in claim 1, wherein said second-order gm-C filter comprises:
    a first capacitor; and
    a second capacitor.

16. A filter apparatus for receiving a reference frequency signal having a reference frequency to generate a control voltage to tune one of a cut-off frequency and a center frequency of a slave gm-C filter, said filter apparatus comprising:
    a phase shifter comprising two operational transconductance amplifiers forming an inductance and at least one capacitor, said phase shifter being adapted to receive said reference frequency signal and change a phase of said reference frequency signal in accordance with said control voltage;
    a phase comparator connected to said phase shifter, said phase comparator being adapted to compare a phase of an output signal of said phase shifter with said phase of said reference frequency signal to generate a phase error signal; and
    a loop filter, connected to said phase comparator, said loop filter being adapted to exclude an AC component from said phase error signal to generate a DC component thereof as said control voltage, and
    a phase locked loop of said master circuit being operated so that a loop gain thereof is maximum.

* * * * *